United States Patent
Choi et al.

(10) Patent No.: US 9,698,233 B2
(45) Date of Patent: Jul. 4, 2017

(54) TUNNEL INSULATION LAYER STRUCTURES, METHODS OF MANUFACTURING THE SAME, AND VERTICAL MEMORY DEVICES INCLUDING THE SAME

(71) Applicants: Eun-Yeoung Choi, Seoul (KR); Young-Jin Noh, Suwon-si (KR); Bi-O Kim, Seoul (KR); Kwang-Min Park, Seoul (KR); Jae-Young Ahn, Seongnam-si (KR); Ju-Mi Yun, Pocheon (KR); Jae-Ho Choi, Busan (KR); Ki-Hyun Hwang, Seongnam-si (KR)

(72) Inventors: Eun-Yeoung Choi, Seoul (KR); Young-Jin Noh, Suwon-si (KR); Bi-O Kim, Seoul (KR); Kwang-Min Park, Seoul (KR); Jae-Young Ahn, Seongnam-si (KR); Ju-Mi Yun, Pocheon (KR); Jae-Ho Choi, Busan (KR); Ki-Hyun Hwang, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 63 days.

(21) Appl. No.: 14/644,408

(22) Filed: Mar. 11, 2015

(65) Prior Publication Data
US 2015/0279955 A1 Oct. 1, 2015

(30) Foreign Application Priority Data
Mar. 31, 2014 (KR) ........................ 10-2014-0037880

(51) Int. Cl.
*H01L 29/792* (2006.01)
*H01L 29/51* (2006.01)
(Continued)

(52) U.S. Cl.
CPC ...... *H01L 29/513* (2013.01); *H01L 21/28282* (2013.01); *H01L 27/11582* (2013.01); *H01L 29/518* (2013.01)

(58) Field of Classification Search
None
See application file for complete search history.

(56) References Cited

U.S. PATENT DOCUMENTS 7,800,162 B2   9/2010  Lee et al.
8,063,436 B2   11/2011 Bhattacharyya et al.
(Continued)

FOREIGN PATENT DOCUMENTS

KR   1020090000451   1/2009
KR   1020090025597   3/2009
(Continued)

*Primary Examiner* — Ermias Woldegeorgis
(74) *Attorney, Agent, or Firm* — Myers Bigel, P.A.

(57) ABSTRACT

Tunnel insulation layer structures and methods of manufacturing the same are disclosed. The tunnel insulation layer structures may include a first tunnel insulation layer, a second tunnel insulation layer, a third tunnel insulation layer, a fourth tunnel insulation layer and a fifth tunnel insulation layer. The first tunnel insulation layer on a substrate has a first band gap energy. The second tunnel insulation layer on the first tunnel insulation layer has a second band gap energy which is lower than the first band gap energy. The third tunnel insulation layer on the second tunnel insulation layer has a third band gap energy which is higher than the second band gap energy. The fourth tunnel insulation layer on the third tunnel insulation layer has a fourth band gap energy which is lower than the third band gap energy. The fifth tunnel insulation layer on the fourth tunnel insulation layer has a fifth band gap energy which is higher than the fourth band gap energy.

20 Claims, 25 Drawing Sheets

(51) Int. Cl.
*H01L 27/11582* (2017.01)
*H01L 21/28* (2006.01)

(56) References Cited

U.S. PATENT DOCUMENTS

| | | |
|---|---|---|
| 8,198,671 B2 | 6/2012 | Olsen et al. |
| 8,343,840 B2 | 1/2013 | Lai et al. |
| 2009/0096008 A1 | 4/2009 | Kim et al. |
| 2010/0157680 A1* | 6/2010 | Higuchi ............ H01L 21/28282 365/185.18 |
| 2013/0270631 A1 | 10/2013 | Kim et al. |

FOREIGN PATENT DOCUMENTS

| KR | 1020100019827 | 2/2010 |
|---|---|---|
| KR | 1020100028819 | 3/2010 |
| KR | 1020120102454 | 9/2012 |

\* cited by examiner

TUNNEL INSULATION LAYER STRUCTURES, METHODS OF MANUFACTURING THE SAME, AND VERTICAL MEMORY DEVICES INCLUDING THE SAME

CROSS-REFERENCE TO RELATED APPLICATION

This U.S. non-provisional application claims priority under 35 U.S.C. §119 to Korean Patent Application No. 10-2014-0037880, filed on Mar. 31, 2014, in the Korean Intellectual Property Office (KIPO), the disclosure of which is herein incorporated by reference in its entirety.

BACKGROUND

1. Field

Example embodiments relate to a tunnel insulation layer structure, a method of manufacturing a tunnel insulation layer structure, and a vertical memory device including a tunnel insulation layer structure. More particularly, example embodiments relate to a vertical memory device having a vertical channel and including the tunnel insulation layer structure.

2. Description of the Related Art

In methods of manufacturing vertical memory devices, an insulation layer and a sacrificial layer may be alternately and repeatedly formed on a substrate. Holes may be formed through the insulation layers and the sacrificial layers. Channels may be formed to fill the holes. Openings may be formed through the insulation layers and the sacrificial layers. The sacrificial layers exposed by the openings may be removed to form gaps exposing the channels. Tunnel insulation layer structures and gate structures including gate electrodes may be formed to fill the gaps.

In this case, a tunnel insulation layer may be disposed between a charge storage layer and the channel. An electrical characteristic of the tunnel insulation layer may be important for determining a performance of the vertical memory device. When a thickness or an equivalent oxide thickness (EOT) of the tunnel insulation layer is large, a program/erase operation of the vertical memory device may be slow. While, when a thickness or an equivalent oxide thickness (EOT) of the tunnel insulation layer is small, a retention characteristic of the vertical memory device may be degraded. Therefore, a vertical memory device having an improved reliability has been studied.

SUMMARY

Example embodiments provide a tunnel insulation layer structure having an improved reliability.

Example embodiments provide a vertical memory device having an improved reliability.

Example embodiments provide a method of manufacturing a vertical memory device having an improved reliability.

According to example embodiments, there is provided a tunnel insulation layer structure including a first tunnel insulation layer, a second tunnel insulation layer, a third tunnel insulation layer, a fourth tunnel insulation layer and a fifth tunnel insulation layer. The first tunnel insulation layer on a substrate has a first band gap energy. The second tunnel insulation layer on the first tunnel insulation layer has a second band gap energy which is lower than the first band gap energy. The third tunnel insulation layer on the second tunnel insulation layer has a third band gap energy which is higher than the second band gap energy. The fourth tunnel insulation layer on the third tunnel insulation layer has a fourth band gap energy which is lower than the third band gap energy. The fifth tunnel insulation layer on the fourth tunnel insulation layer has a fifth band gap energy which is higher than the fourth band gap energy.

In example embodiments, the first tunnel insulation layer, the third tunnel insulation layer and the fifth tunnel insulation layer may include silicon oxide. The second tunnel insulation layer and the fourth tunnel insulation layer may include silicon oxy-nitride.

In example embodiments, nitrogen concentrations of the second tunnel insulation layer and the fourth tunnel insulation layer may be higher than about 20 at %.

In example embodiments, the first tunnel insulation layer may include silicon oxide. The second tunnel insulation layer, the third tunnel insulation layer, the fourth tunnel insulation layer and the fifth tunnel insulation layer may include silicon oxy-nitride. Nitrogen concentrations of the second tunnel insulation layer and the fourth tunnel insulation layer may be higher than nitrogen concentrations of the third tunnel insulation layer and the fifth tunnel insulation layer.

In example embodiments, nitrogen concentrations of the second tunnel insulation layer and the fourth tunnel insulation layer may be higher than about 20 at %. Nitrogen concentrations of the third tunnel insulation layer and the fifth tunnel insulation layer may be lower than about 10 at %.

In example embodiments, a thickness of the third tunnel insulation layer may be smaller than a thickness of the second tunnel insulation layer.

In example embodiments, a thickness of the second tunnel insulation layer may be smaller than a thickness of the fourth tunnel insulation layer.

In example embodiments, the tunnel insulation layer structure may further include a sixth tunnel insulation layer between the fourth tunnel insulation layer and the fifth tunnel insulation layer. The sixth tunnel insulation layer may have a sixth band gap energy which is higher than the fourth band gap energy, and lower than the fifth band gap energy.

According to example embodiments, there is provided a method of manufacturing a tunnel insulation layer structure. In the method, a first tunnel insulation layer is formed on a substrate. The first tunnel insulation layer has a first band gap energy. A second tunnel insulation layer is formed on the first tunnel insulation layer. The second tunnel insulation layer has a second band gap energy which is lower than the first band gap energy. A third tunnel insulation layer is formed on the second tunnel insulation layer. The third tunnel insulation layer has a third band gap energy which is higher than the second band gap energy. A fourth tunnel insulation layer is formed on the third tunnel insulation layer. The fourth tunnel insulation layer has a fourth band gap energy which is lower than the third band gap energy. A fifth tunnel insulation layer is formed on the fourth tunnel insulation layer. The fifth tunnel insulation layer has a fifth band gap energy which is higher than the fourth band gap energy.

In example embodiments, forming the second tunnel insulation layer may include depositing silicon oxy-nitride layer. Forming the fourth tunnel insulation layer may include depositing silicon oxy-nitride layer.

In example embodiments, the second tunnel insulation layer may have a thickness of about 10 Å to about 30 Å.

In example embodiments, forming the third tunnel insulation layer may include partially oxidizing the second tunnel insulation layer.

In example embodiments, partially oxidizing the second tunnel insulation layer may include using $O_2$ gas, $H_2$ gas and $O_2$ gas, $N_2O$ gas or NO gas.

In example embodiments, forming the third tunnel insulation layer may include removing shallow trap site in the second tunnel insulation layer.

In example embodiments, the third tunnel insulation layer may have a thickness below about 10 Å.

In example embodiments, forming the fifth tunnel insulation layer may include partially oxidizing the fourth tunnel insulation layer.

In example embodiments, partially oxidizing the fourth tunnel insulation layer may include using $N_2O$ gas, $O_2$ gas or NO gas.

According to example embodiments, there is provided a vertical memory device including a channel, a charge storage layer structure and a plurality of gate electrodes. The channel extends in a first direction substantially perpendicular to a top surface of the substrate. The charge storage layer structure may include a tunnel insulation layer structure, a charge storage layer pattern and a blocking layer pattern which are sequentially stacked on a sidewall of the channel in a second direction substantially parallel to the top surface of the substrate. The plurality of gate electrodes is arranged on a sidewall of the charge storage layer structure, and is spaced apart from each other in the first direction. The charge storage layer structure may include at least four tunnel insulation layers.

In example embodiments, each of the tunnel insulation layers may have a band gap energy which is different from band gap energies of adjacent tunnel insulation layers.

In example embodiments, each of the tunnel insulation layers may have a nitrogen concentration which is different from nitrogen concentrations of adjacent tunnel insulation layers.

According to example embodiments, the tunnel insulation layer structure may include at least four tunnel insulation layers, preferably five tunnel insulation layers, e.g., the first to fifth tunnel insulation layers. The nitrogen concentrations of the third tunnel insulation layer and the fifth tunnel insulation layer may be lower than those of the second tunnel insulation layer and the fourth tunnel insulation layer. During processes for forming the third tunnel insulation layer and the fifth tunnel insulation layer, shallow trap sites may be removed or reduced from the second tunnel insulation layer or the fourth tunnel insulation layer, so that a charge loss from deep trap sites may be prevented. Therefore, when the tunnel insulation layer structure is used in a non-volatile memory device, an initial voltage shift problem of the non-volatile memory device may be resolved or may be reduced.

BRIEF DESCRIPTION OF THE DRAWINGS

Example embodiments will be more clearly understood from the following detailed description taken in conjunction with the accompanying drawings.

FIG. 1 is a cross-sectional view illustrating a tunnel insulation layer structure in accordance with example embodiments;

FIG. 2 is a cross-sectional view illustrating a tunnel insulation layer structure in accordance with example embodiments;

FIG. 3 is a cross-sectional view illustrating a tunnel insulation layer structure in accordance with example embodiments;

FIG. 4 is a cross-sectional view illustrating a tunnel insulation layer structure in accordance with example embodiments;

FIGS. 5 to 8 are cross-sectional views illustrating a method of manufacturing a tunnel insulation layer structure in accordance with example embodiments;

FIG. 9 is a cross-sectional view illustrating a memory device in accordance with example embodiments;

FIG. 10 is a cross-sectional view illustrating a memory device in accordance with example embodiments;

FIG. 11 is a cross-sectional view illustrating a memory device in accordance with example embodiments;

FIG. 12 is a cross-sectional view illustrating a vertical memory device in accordance with example embodiments;

FIG. 13 is a cross-sectional view illustrating a vertical memory device in accordance with example embodiments;

FIG. 14 is an enlarged cross-sectional view of region II of FIG. 13;

FIG. 15 is a cross-sectional view illustrating a vertical memory device in accordance with example embodiments;

FIG. 16 is an enlarged cross-sectional view of region III of FIG. 15;

FIGS. 17 to 23 are cross-sectional views illustrating a method of manufacturing a vertical memory device in accordance with example embodiments;

FIGS. 24 to 29 are cross-sectional views illustrating a method of manufacturing a vertical memory device in accordance with example embodiments;

FIG. 30 illustrates a block diagram of a memory system in accordance with example embodiments; and FIG. 31 illustrates a block diagram of an electronic system in accordance with example embodiments.

DETAILED DESCRIPTION

Figure 1:
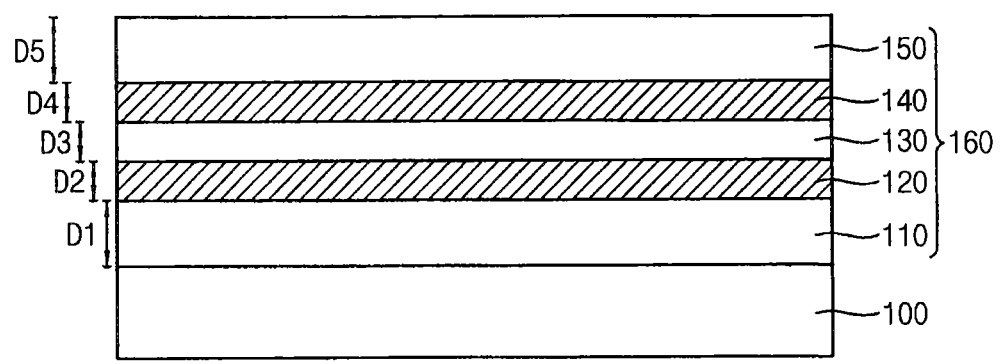
FIGS. 1 to 31 represent non-limiting, example embodiments as described herein.

Example embodiments will now be described more fully with reference to the accompanying drawings, in which example embodiments are shown. Example embodiments may, however, be embodied in many different forms and should not be construed as limited to the example embodiments set forth herein. In the drawings, the thicknesses of layers and regions are exaggerated for clarity. Like reference numerals in the drawings denote like elements, and thus their description will be omitted.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms first, second, third, etc. may be used herein to describe various elements, components, regions, layers and/or sections, these elements, components, regions, layers and/or sections should not be limited by these terms. Unless indicated otherwise, these terms are only used to distinguish one element, component, region, layer or section from another region, layer or section. Thus, a first element, component, region, layer or section discussed below could be termed a second element, component, region, layer or section without departing from the teachings of the example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to limit the scope of the present disclosure.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a cross-sectional view illustrating a tunnel insulation layer structure in accordance with example embodiments;

Referring to FIG. 1, a tunnel insulation layer structure 160 may be disposed on a substrate 100.

The substrate 100 may include a semiconductor substrate. For example, the substrate 100 may include a silicon substrate, a germanium substrate, a silicon-germanium substrate, a silicon-on-insulator (SOI) substrate, a germanium-on-insulator (GOI) substrate, etc.

The tunnel insulation layer structure 160 may include a plurality of tunnel insulation layers. In example embodiments, the tunnel insulation layer structure 160 may include at least four tunnel insulation layers, preferably five tunnel insulation layers, which may be stacked sequentially. Further, each of the tunnel insulation layers may include a material which is different from that of adjacent tunnel insulation layers.

In example embodiments, the tunnel insulation layer structure 160 may include a first tunnel insulation layer 110, a second tunnel insulation layer 120, a third tunnel insulation layer 130 and a fourth tunnel insulation layer 140 and a fifth tunnel insulation layer 150 as illustrated in FIG. 1.

The first tunnel insulation layer 110 may be disposed over the substrate 100. The first tunnel insulation layer 110 may have a first thickness D1. For example, the first tunnel insulation layer 110 may have a thickness of about 10 Å to about 30 Å.

The first tunnel insulation layer 110 may have a first insulation material. For example, the first tunnel insulation layer 110 may include silicon oxide. That is, the first tunnel insulation layer 110 may include a material of $SiO_X$, and may further include an inevitable impurity. Therefore, the first tunnel insulation layer 110 may have a first band gap energy. The band gap energy may generally refer to the energy difference (in electron volts) between the top of the valence band and the bottom of the conduction band in insulators and semiconductors.

The second tunnel insulation layer 120 may be disposed on the first tunnel insulation layer 110. The second tunnel insulation layer 120 may have a second thickness D2. For example, the second tunnel insulation layer 120 may have a thickness of about 5 Å to about 20 Å.

Further, the second tunnel insulation layer 120 may include a second insulation material which may be different from the first insulation material of the first tunnel insulation layer 110. For example, the second tunnel insulation layer 120 may include silicon oxy-nitride ($SiO_{Y1}N_{Z1}$). That is, a nitrogen concentration of the second tunnel insulation layer 120 may be higher than that of the first tunnel insulation layer 110. The nitrogen concentration of the second tunnel insulation layer 120 may be higher than about 20 at %, when measured by X-ray Photoelectron Spectroscopy (XPS).

As the nitrogen concentration of the second tunnel insulation layer 120 increases, a band gap energy of the second tunnel insulation layer 120 may decrease. That is, the second band gap energy of the second tunnel insulation layer 120 may be lower than the first band gap energy of the first tunnel insulation layer 110.

The third tunnel insulation layer 130 may be disposed on the second tunnel insulation layer 120. In example embodiments, the third tunnel insulation layer 130 may have a third thickness D3 which may be smaller than the second thickness D2 of the second tunnel insulation layer 120. For example, the third tunnel insulation layer 130 may have a thickness of about 5 Å to about 15 Å. Preferably, the third tunnel insulation layer 130 may have a thickness of about 5 Å to about 10 Å.

The third tunnel insulation layer 130 may have a third insulation material which may be different from the second insulation material of the second tunnel insulation layer 120. In some example embodiments, the third tunnel insulation layer 130 may include silicon oxide ($SiO_X$). In some example embodiments, the third tunnel insulation layer 130 may include silicon oxy-nitride ($SiO_{Y2}N_{Z2}$), wherein Z2<Z1. That is, a nitrogen concentration of the third tunnel insulation layer 130 may be lower than that of the second tunnel insulation layer 120. For example, the nitrogen concentration of the third tunnel insulation layer 130 may be lower than about 10 at %, when measured by X-ray Photoelectron Spectroscopy (XPS).

As the nitrogen concentration of the third tunnel insulation layer 130 decreases, a band gap energy of the third tunnel insulation layer 130 may increase. That is, the third band gap energy of the third tunnel insulation layer 130 may be higher than the second band gap energy of the second tunnel insulation layer 120, and may be substantially identical to or lower than the first band gap energy of the first tunnel insulation layer 110.

The fourth tunnel insulation layer 140 may be disposed on the third tunnel insulation layer 130. The fourth tunnel insulation layer 140 may have a fourth thickness D4 which may be greater than the third thickness D3 of the third tunnel insulation layer 130. For example, the fourth tunnel insulation layer 140 may have a thickness of about 5 Å to about 20 Å.

The fourth tunnel insulation layer 140 may have a fourth insulation material which may be different from the third insulation material of the third tunnel insulation layer 130. In example embodiments, the fourth tunnel insulation layer 140 may include silicon oxy-nitride ($SiO_{Y3}N_{Z3}$). That is, a nitrogen concentration of the fourth tunnel insulation layer 140 may be higher than that of the third tunnel insulation layer 130. For example, the nitrogen concentration of the fourth tunnel insulation layer 140 may be higher than about 20 at %, when measured by X-ray Photoelectron Spectroscopy (XPS).

Further, the fourth tunnel insulation layer 140 may have a fourth band gap energy which may be lower than the third band gap energy of the third tunnel insulation layer 130.

In example embodiments, fifth tunnel insulation layer 150 may be disposed on the fourth tunnel insulation layer 140. The fifth tunnel insulation layer 150 may include a fifth insulation material which may be different from the fourth insulation material. In some example embodiments, the fifth tunnel insulation layer 150 may include silicon oxide ($SiO_X$). In some example embodiments, the fifth tunnel insulation layer 150 may include silicon oxy-nitride ($SiO_{Z4}N_{Z4}$), wherein Z4<Z3. Therefore, a nitrogen concentration of the fifth tunnel insulation layer 150 may be lower than that of fourth tunnel insulation layer 140. For example, the nitrogen concentration of the fifth tunnel insulation layer 150 may be lower than about 10 at %, when measured by X-ray Photoelectron Spectroscopy (XPS).

The fifth tunnel insulation layer 150 may have a fifth band gap energy, and the fifth band gap energy may be higher than the fourth band gap energy.

In example embodiments, the fifth tunnel insulation layer 150 may include a material which may be identical to that of the third tunnel insulation layer 130. For example, when the third tunnel insulation layer 130 includes silicon oxide, the fifth tunnel insulation layer 150 may include silicon oxide. Alternatively, the third tunnel insulation layer 130 and the fifth tunnel insulation layer 150 may include silicon oxy-nitride.

The first to fifth tunnel insulation layers 110, 120, 130, 140 and 150 may be stacked sequentially in a direction perpendicular to a top surface of the substrate 100 as illustrated in FIG. 1, however the present invention may not be limited thereto. For example, the first to fifth tunnel insulation layers 110, 120, 130, 140 and 150 may be stacked sequentially in a direction parallel to the top surface of the substrate 100.

According to example embodiments, the tunnel insulation layer structure 160 may include the first to fifth tunnel insulation layers 110, 120, 130, 140 and 150, and the nitrogen concentrations of the second tunnel insulation layer 120 and the fourth tunnel insulation layer 140 may be lower than those of the first tunnel insulation layer 110, the third tunnel insulation layer 130 and the fifth tunnel insulation layer 150. That is, the tunnel insulation layer structure 160 may have a structure of $SiO_X/SiO_{Y1}N_{Z1}/SiO_X/SiO_{Y3}N_{Z3}/SiO_X$ or a structure of $SiO_X/SiO_{Y1}N_{Z1}/SiO_{Y2}N_{Z2}/SiO_{Y3}N_{Z3}/SiO_{Y4}N_{Z4}$, wherein Z1>Z2, and Z3>Z4. That is, the third tunnel insulation layer 130 may be disposed between the second tunnel insulation layer 120 and the fourth tunnel insulation layer 140. During processes for forming the third tunnel insulation layer 130 and the fifth tunnel insulation layer 150, shallow trap sites may be removed from the second tunnel insulation layer 120 or the fourth tunnel insulation layer 140, so that a charge loss of deep trap site may be prevented. Therefore, when the tunnel insulation layer structure 160 is used in a non-volatile memory device, an initial voltage shift problem may be resolved or may be reduced.

The third tunnel insulation layer 130 may have the third band gap energy which may be higher than those of the second tunnel insulation layer 120 and the fourth tunnel insulation layer 140. However, when the third tunnel insulation layer 130 has a thickness below 10 Å, an electron or a hole may penetrate the third tunnel insulation layer 130 by a resonance tunneling effect. Therefore, the third tunnel insulation layer 130 having a thickness below 10 Å may not degrade the speed of program/erase operation of the non-volatile memory.

Figure 2:
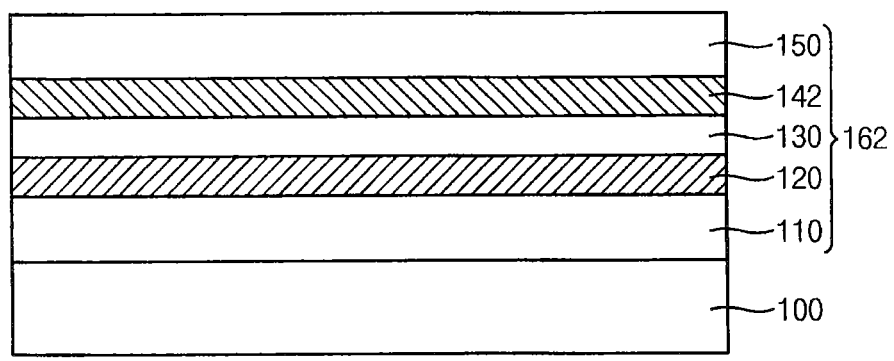

FIG. 2 is a cross-sectional view illustrating a tunnel insulation layer structure in accordance with example embodiments.

Referring to FIG. 2, a tunnel insulation layer structure 162 may be disposed on a substrate 100. The tunnel insulation layer structure 162 may be substantially identical to or similar to the tunnel insulation layer structure 160 of FIG. 1 except for a fourth tunnel insulation layer 142. Therefore, a repeated description will be omitted.

In example embodiments, the tunnel insulation layer structure 162 may include a first tunnel insulation layer 110, a second tunnel insulation layer 120, a third tunnel insulation layer 130, a fourth tunnel insulation layer 142 and a fifth tunnel insulation layer 150.

The fourth tunnel insulation layer 142 may be disposed on the third tunnel insulation layer 130. A nitrogen concentration of the fourth tunnel insulation layer 142 may be higher than those of the third tunnel insulation layer 130 and the second tunnel insulation layer 120. For example, the fourth tunnel insulation layer 142 may include silicon oxy-nitride. Therefore, the fourth tunnel insulation layer 142 may have a band gap energy which may be lower than those of the third tunnel insulation layer 130 and the second tunnel insulation layer 120.

According to example embodiments, the tunnel insulation layer structure 162 may include the second tunnel insulation layer 120 and the fourth tunnel insulation layer 142 which may have different band gap energy. That is, by adjusting the band gap energy of the fourth tunnel insulation layer 142, a reliability of the tunnel insulation layer structure 162 may be improved.

Figure 3:
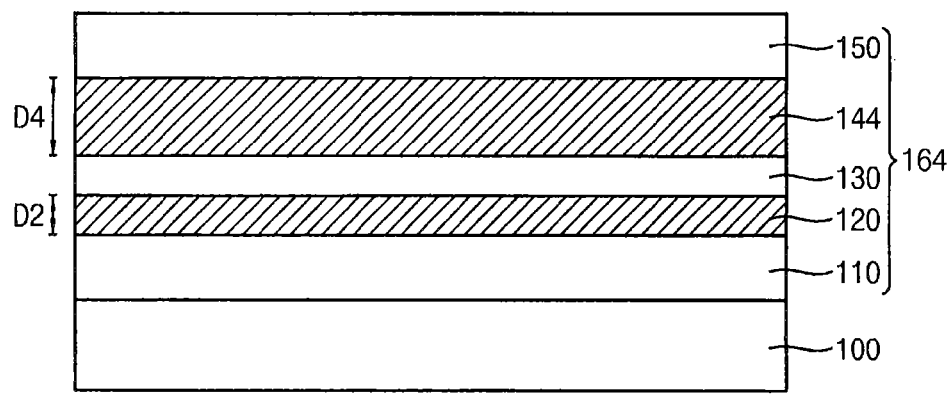

FIG. 3 is a cross-sectional view illustrating a tunnel insulation layer structure in accordance with example embodiments.

Referring to FIG. 3, a tunnel insulation layer structure 164 may be disposed on a substrate 100. The tunnel insulation layer structure 164 may be substantially identical to or similar to the tunnel insulation layer structure 160 of FIG. 1 except for a fourth tunnel insulation layer 144. Therefore, a repeated description will be omitted.

In example embodiments, the tunnel insulation layer structure 164 may include a first tunnel insulation layer 110, a second tunnel insulation layer 120, a third tunnel insulation layer 130, a fourth tunnel insulation layer 144 and a fifth tunnel insulation layer 150.

The fourth tunnel insulation layer 144 may be disposed on the third tunnel insulation layer 130. The fourth tunnel insulation layer 144 may have a fourth thickness D4, and the fourth thickness D4 may be substantially greater than a second thickness D2 of the second tunnel insulation layer 120.

In example embodiments, the tunnel insulation layer structure 164 may include the second tunnel insulation layer 120 and the fourth tunnel insulation layer 144 which may have different thicknesses. That is, by adjusting the fourth thickness D4 of the fourth tunnel insulation layer 144, a reliability of the tunnel insulation layer structure 164 may be improved.

Figure 4:
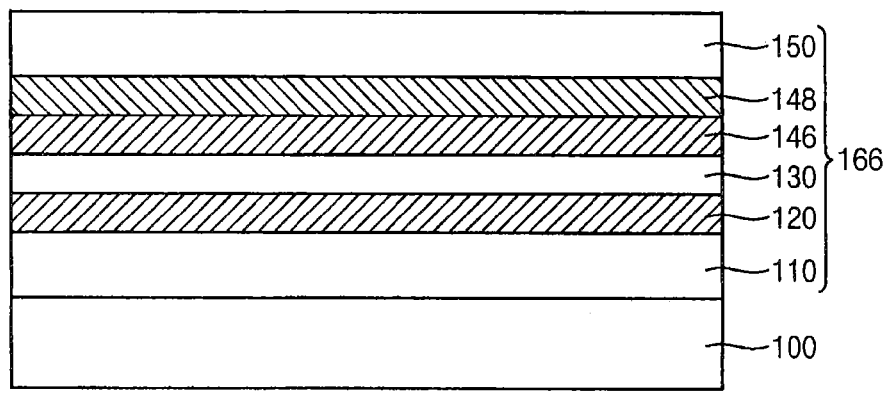

FIG. 4 is a cross-sectional view illustrating a tunnel insulation layer structure in accordance with example embodiments.

Referring to FIG. 4, a tunnel insulation layer structure 166 may be disposed on a substrate 100. The tunnel insulation layer structure 166 may be substantially identical to or similar to the tunnel insulation layer structure 160 of FIG. 1 except for a fourth tunnel insulation layer 146 and the sixth tunnel insulation layer 148. Therefore, a repeated description will be omitted.

In example embodiments, the tunnel insulation layer structure 166 may include a first tunnel insulation layer 110, a second tunnel insulation layer 120, a third tunnel insulation layer 130, the fourth tunnel insulation layer 146, the sixth tunnel insulation layer 148 and a fifth tunnel insulation layer 150.

The fourth tunnel insulation layer 146 may be disposed on the third tunnel insulation layer 130, and the sixth tunnel insulation layer 148 may be directly disposed on the fourth tunnel insulation layer 146. Nitrogen concentrations of the fourth tunnel insulation layer 146 and the sixth tunnel insulation layer 148 may be higher than that of the third tunnel insulation layer 130. In example embodiments, the fourth tunnel insulation layer 146 and the sixth tunnel insulation layer 148 may include silicon oxy-nitride (SiON) which may be different from each other. For example, the nitrogen concentration of the sixth tunnel insulation layer 148 may be lower than that of the fourth tunnel insulation layer 146, and may be higher than that of the fifth tunnel insulation layer 150. Therefore, the sixth tunnel insulation layer 148 may have a sixth band gap energy which may be positioned between the fourth tunnel insulation layer 146 and the fifth tunnel insulation layer 150.

Referring to FIG. 4, the fourth and the six tunnel insulation layers 146 and 148 may be disposed between the third tunnel insulation layer 130 and the fifth tunnel insulation layer 150, however the present invention may not be limited thereto. For example, three or four tunnel insulation layers may be disposed between the third tunnel insulation layer 130 and the fifth tunnel insulation layer 150, and nitrogen concentrations of the three or four tunnel insulation layers may be higher than those of the third and the fifth three or four tunnel insulation layers 130 and 150.

FIGS. 5 to 8 are cross-sectional views illustrating a method of manufacturing a tunnel insulation layer structure in accordance with example embodiments.

Figure 5:
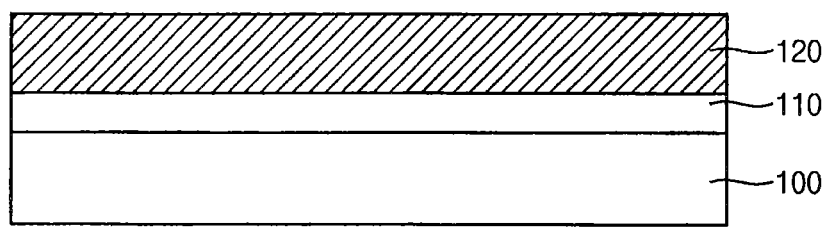

Referring to FIG. 5, a first tunnel insulation layer 110 and a second tunnel insulation layer 120 may be sequentially formed on a substrate 100.

The first tunnel insulation layer 110 may be formed on the substrate 100. In example embodiments, the first tunnel insulation layer 110 may be formed by partially oxidizing a top surface of the substrate 100. In this case, when the substrate 100 includes a silicon substrate, the first tunnel insulation layer 110 may include silicon oxide ($SiO_X$). In some example embodiments, the first tunnel insulation layer 110 may be formed by a chemical vapor deposition (CVD) process or an atomic layer deposition (ALD) process.

Then, the second tunnel insulation layer 120 may be formed on the first tunnel insulation layer 110. In example embodiments, the second tunnel insulation layer 120 may be formed by a CVD process or an ALD process. The second tunnel insulation layer 120 may be formed using a material which may be substantially identical to the second tunnel insulation layer 120 described with reference to FIG. 1. That is, the second tunnel insulation layer 120 may be formed using silicon oxy-nitride ($SiO_{Y1}N_{Z1}$). The nitrogen concentration of the second tunnel insulation layer 120 may be higher than about 20 at %, when measured by X-ray Photoelectron Spectroscopy (XPS).

Further, each of the first tunnel insulation layer 110 and the second tunnel insulation layer 120 may have a thickness of about 10 Å to about 30 Å.

Figure 6:
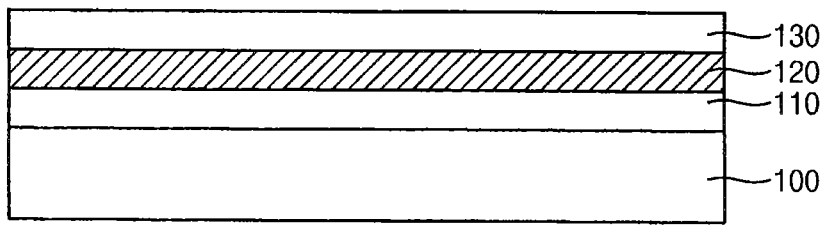

Referring to FIG. 6, a third tunnel insulation layer 130 may be formed on the second tunnel insulation layer 120.

The third tunnel insulation layer 130 may be formed by performing a curing process about the second tunnel insulation layer 120.

In example embodiments, the curing process may include partially oxidizing the second tunnel insulation layer 120 at a predetermined temperature and at an atmosphere including an oxidizing gas. In this case, the substrate 100 including the second tunnel insulation layer 120 may be loaded into a chamber, and the oxidizing gas may flow into the chamber. For example, the oxidizing gas may include $O_2$ gas, $H_2/O_2$ gas, $N_2O$ gas or NO gas. Preferably, $O_2$ gas and $H_2$ gas may flow into the chamber in order to oxidizing the second tunnel insulation layer 120. Therefore, the third tunnel insulation layer 130 may be formed by oxidizing an upper portion of the second tunnel insulation layer 120.

The third tunnel insulation layer 130 formed by the curing process may have a nitrogen concentration which may be lower than that of the second tunnel insulation layer 120. In some example embodiments, the third tunnel insulation layer 130 may include silicon oxide ($SiO_X$). In some example embodiments, the third tunnel insulation layer 130 may include silicon oxy-nitride ($SiO_{Y2}N_{Z2}$). For example, the nitrogen concentration of the third tunnel insulation layer 130 may be lower than about 10 at %, when measured by X-ray Photoelectron Spectroscopy (XPS).

Further, during the curing process, a shallow trap site in the second tunnel insulation layer 120 may be removed or reduced. Therefore, a tunnel insulation layer structure may have an improved reliability.

Further, the third tunnel insulation layer 130 may have a thickness which may be smaller than that of the second tunnel insulation layer 120. For example, the third tunnel insulation layer 130 may have a thickness of about 5 Å to about 10 Å. When the third tunnel insulation layer 130 has a thickness below 10 Å, an electron or a hole may penetrate the third tunnel insulation layer 130 by a resonance tunneling effect. Therefore, the third tunnel insulation layer 130 having a thickness below 10 Å may not degrade the program/erase operation speed of the non-volatile memory.

Figure 7:
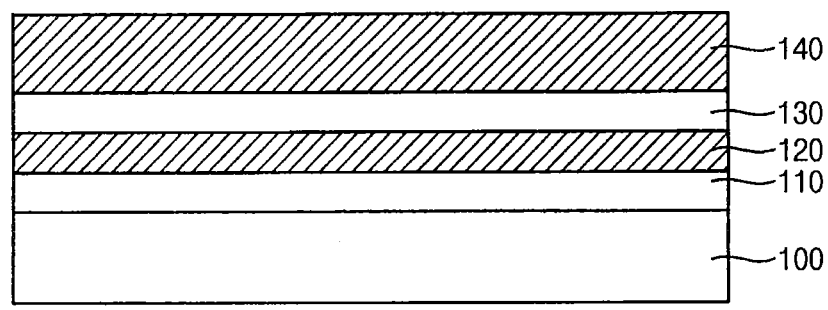

Referring to FIG. 7, a fourth tunnel insulation layer 140 may be formed on the third tunnel insulation layer 130.

A process for forming the fourth tunnel insulation layer 140 may be substantially identical to or similar to the process for forming the second tunnel insulation layer 120.

In some example embodiments, the fourth tunnel insulation layer 140 and the second tunnel insulation layer 120 may include the same material, and may have the same thickness.

In some example embodiments, the fourth tunnel insulation layer 140 and the second tunnel insulation layer 120 may include different materials. Alternatively, the fourth tunnel insulation layer 140 may include a thickness which may be greater than that of the second tunnel insulation layer 120. In some example embodiments, the fourth tunnel insulation layer 140 may have multi layer structure.

Figure 8:
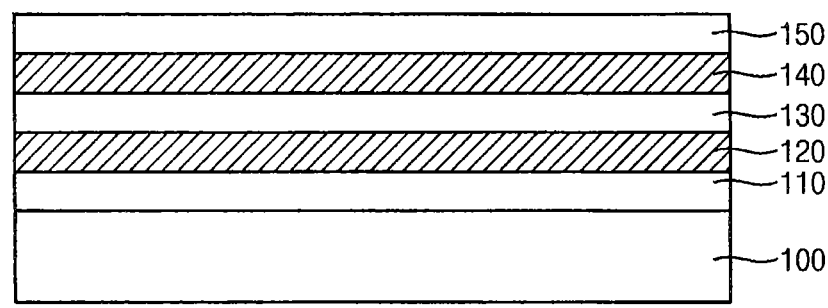

Referring to FIG. 8, a fifth tunnel insulation layer 150 may be formed on the fourth tunnel insulation layer 140.

The fifth tunnel insulation layer 150 may be formed by performing a curing process about the fourth tunnel insulation layer 140. The curing process may be substantially identical to or similar to that described with reference to FIG. 6.

In example embodiments, the curing process may use an oxidizing gas which may be different from that described with reference to FIG. 6. For example, the oxidizing gas may include $N_2O$ gas, $NO/O_2$ gas or NO gas.

The fifth tunnel insulation layer 150 formed by the curing process may have a nitrogen concentration which may be lower than that of the fourth tunnel insulation layer 140. In some example embodiments, the fifth tunnel insulation layer 150 may include silicon oxide ($SiO_X$). In some example embodiments, the fifth tunnel insulation layer 150 may include silicon oxy-nitride ($SiO_{Y4}N_{Z4}$). For example, the nitrogen concentration of the fifth tunnel insulation layer 150 may be lower than about 10 at %, when measured by X-ray Photoelectron Spectroscopy (XPS).

The fifth tunnel insulation layer 150 may have a thickness which may be greater than that of the fourth tunnel insulation layer 140. In example embodiments, the first and the fifth tunnel insulation layers 110 and 150 may have the same thickness, so that the tunnel insulation layer structure 160 may have a symmetric structure.

According to example embodiments, the tunnel insulation layer structure 160 may include the first to fifth tunnel insulation layers 110, 120, 130, 140 and 150, and the nitrogen concentrations of the second tunnel insulation layer 120 and the fourth tunnel insulation layer 140 may be higher than those of the third tunnel insulation layer 130 and the fifth tunnel insulation layer 150 which may be formed by the curing process. During the processes for forming the third tunnel insulation layer 130 and the fifth tunnel insulation layer 150, shallow trap sites may be removed from the second tunnel insulation layer 120 or the fourth tunnel insulation layer 140, so that a charge loss from deep trap site may be prevented. Therefore, when the tunnel insulation layer structure 160 is used in a non-volatile memory device, an initial voltage shift problem may be resolved or may be reduced.

Figure 9:
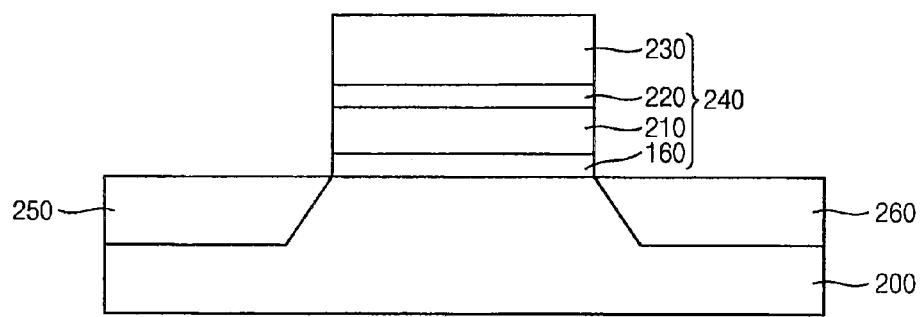

FIG. 9 is a cross-sectional view illustrating a memory device in accordance with example embodiments.

Referring to FIG. 9, the memory device may include a substrate 200, a gate structure 240, a first impurity region 250 and a second impurity region 260.

The substrate 200 may include a semiconductor substrate. For example, the substrate 200 may include a silicon substrate, a germanium substrate, a silicon-germanium substrate, a silicon-on-insulator (SOI) substrate, a germanium-on-insulator (GUI) substrate, etc. The substrate 200 may be divided into an active region and a field region by isolation layers which may extend in a first direction, and may be arranged in a second direction substantially perpendicular to the first direction.

The gate structure 240 may be disposed on the substrate 200. In example embodiments, the gate structure 240 may include a tunnel insulation layer structure 160, a charge storage layer pattern 210, a blocking layer pattern 220 and a gate electrode 230 which may be stacked sequentially.

In example embodiments, the tunnel insulation layer structure 160 may be substantially identical to the tunnel insulation layer structure 160 described with reference to FIG. 1. Alternatively, the tunnel insulation layer structure 160 may be substantially identical to those described with reference to FIG. 2, FIG. 3 or FIG. 4.

The charge storage layer pattern 210 may be disposed on the tunnel insulation layer structure 160. Further, the charge storage layer pattern 210 may include a material which may trap or store a charge. For example, the charge storage layer pattern 210 may include silicon nitride.

The blocking layer pattern 220 may be disposed on the charge storage layer pattern 210. Further, the blocking layer pattern 220 may have a multi layer structure including oxide, nitride or oxy-nitride. In example embodiments, the blocking layer pattern 220 may have a dielectric constant which may be higher than that of the tunnel insulation layer structure 160.

The gate electrode 230 may be disposed on the blocking layer pattern 220. The gate electrode 230 may include a material having a relatively low resistance. For example, the gate electrode 230 may include doped polysilicon.

The first impurity region 250 and the second impurity region 260 may be disposed at upper portions of the substrate 200 adjacent to the gate structure 240. The first impurity region 250 and the second impurity region 260 may serve as a source region and a drain region, and an upper portion of the substrate 200 between the first and the second impurity regions 250 and 260 may serve as a channel region.

According to example embodiments, the memory device may include the substrate 200, the tunnel insulation layer structure 160, the charge storage layer pattern 210, the blocking layer pattern 220 and the gate electrode 230. Further, carriers such as electrons or holes may pass through the tunnel insulation layer structure 160, and may be trapped in the charge storage layer pattern 210, so that the memory device may be a non-volatile memory. As mentioned above, the tunnel insulation layer structure 160 may include at least four tunnel insulation layers, preferably five tunnel insulation layers. Further, shallow trap site in the tunnel insulation layer structure 160 may be effectively removed or reduced. Therefore, an initial voltage shift problem of the memory device may be resolved or reduced.

Figure 10:
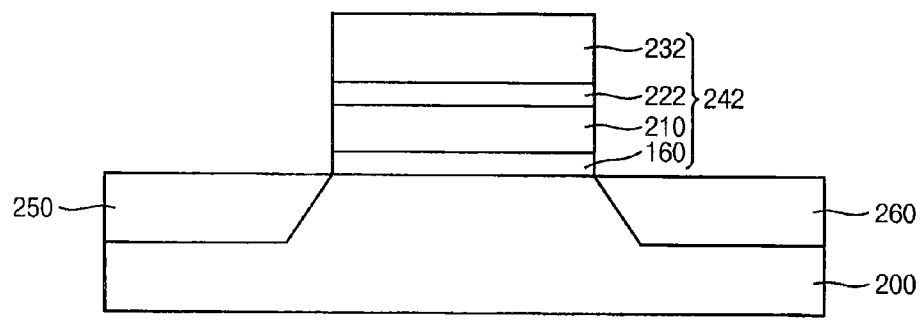

FIG. 10 is a cross-sectional view illustrating a memory device in accordance with example embodiments. The memory device may be substantially similar to the memory device described with reference to FIG. 9 except for a blocking layer pattern 222 and a gate electrode 232.

Referring to FIG. 10, a gate structure 242 disposed on a substrate 200 may include a tunnel insulation layer structure 160, a charge storage layer pattern 210, the blocking layer pattern 222 and the gate electrode 232.

The blocking layer pattern 222 may include a metal oxide having a relatively high dielectric constant. For example, the blocking layer pattern 222 may include aluminum oxide, hafnium oxide, lanthanum oxide, lanthanum aluminum oxide, hafnium lanthanum oxide, hafnium aluminum oxide, titanium oxide, tantalum oxide, zirconium oxide, or mixture thereof. In an example embodiment, the blocking layer pattern 222 may include aluminum oxide.

The gate electrode 232 may include a conductive material. For example, the gate electrode 232 may include tungsten, titanium, titanium nitride, tantalum, tantalum nitride, or a combination thereof. The gate electrode 232 may have a single layer structure or a multi layer structure. In an example embodiment, the gate electrode 232 may include tantalum nitride.

According to example embodiments, the blocking layer pattern 222 may include high-K dielectric material, so that the program/erase operation of the non-volatile memory may be improved.

Figure 11:
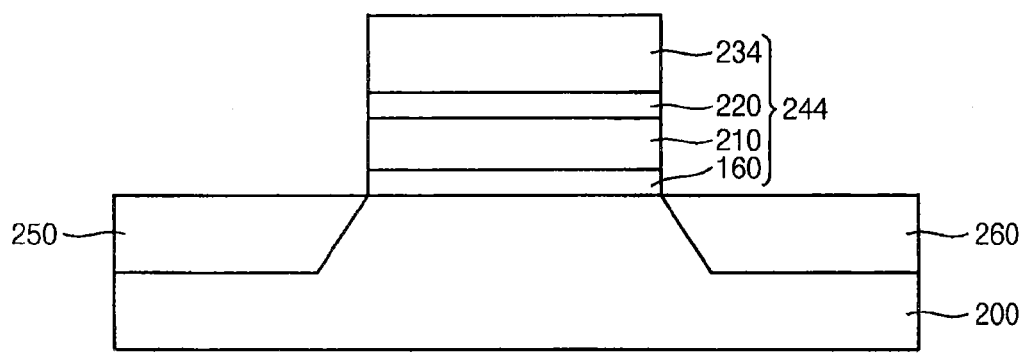

FIG. 11 is a cross-sectional view illustrating a memory device in accordance with example embodiments. The memory device may be substantially similar to the memory device described with reference to FIG. 9 except for a gate electrode 234.

Referring to FIG. 11, a gate structure 244 disposed on a substrate 200 may include a tunnel insulation layer structure 160, a charge storage layer pattern 210, a blocking layer pattern 220 and the gate electrode 234.

The gate electrode 234 may include a conductive material. For example, the gate electrode 234 may include tungsten, titanium, titanium nitride, tantalum, tantalum nitride, or a combination thereof. The gate electrode 234 may have a single layer structure or a multi layer structure.

Figure 12:
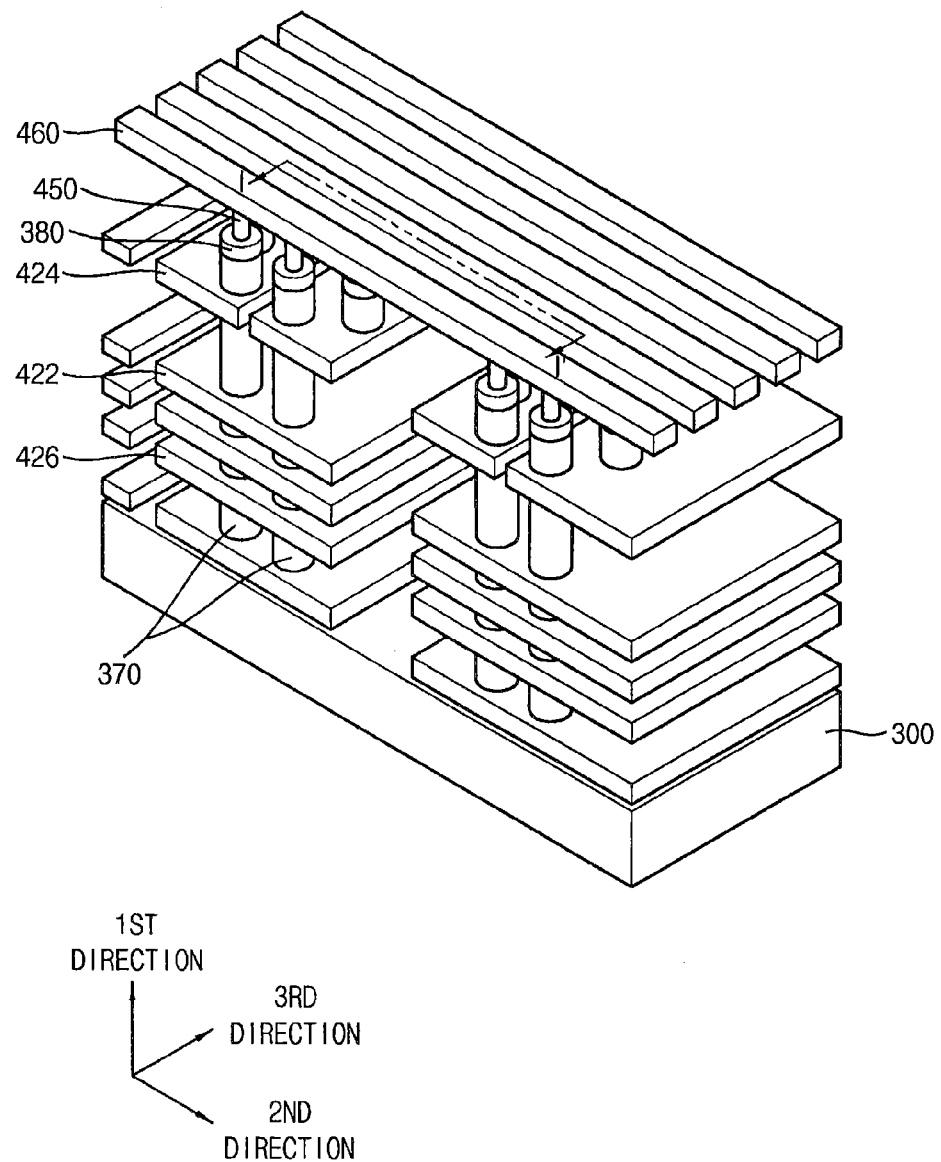
Figure 13:
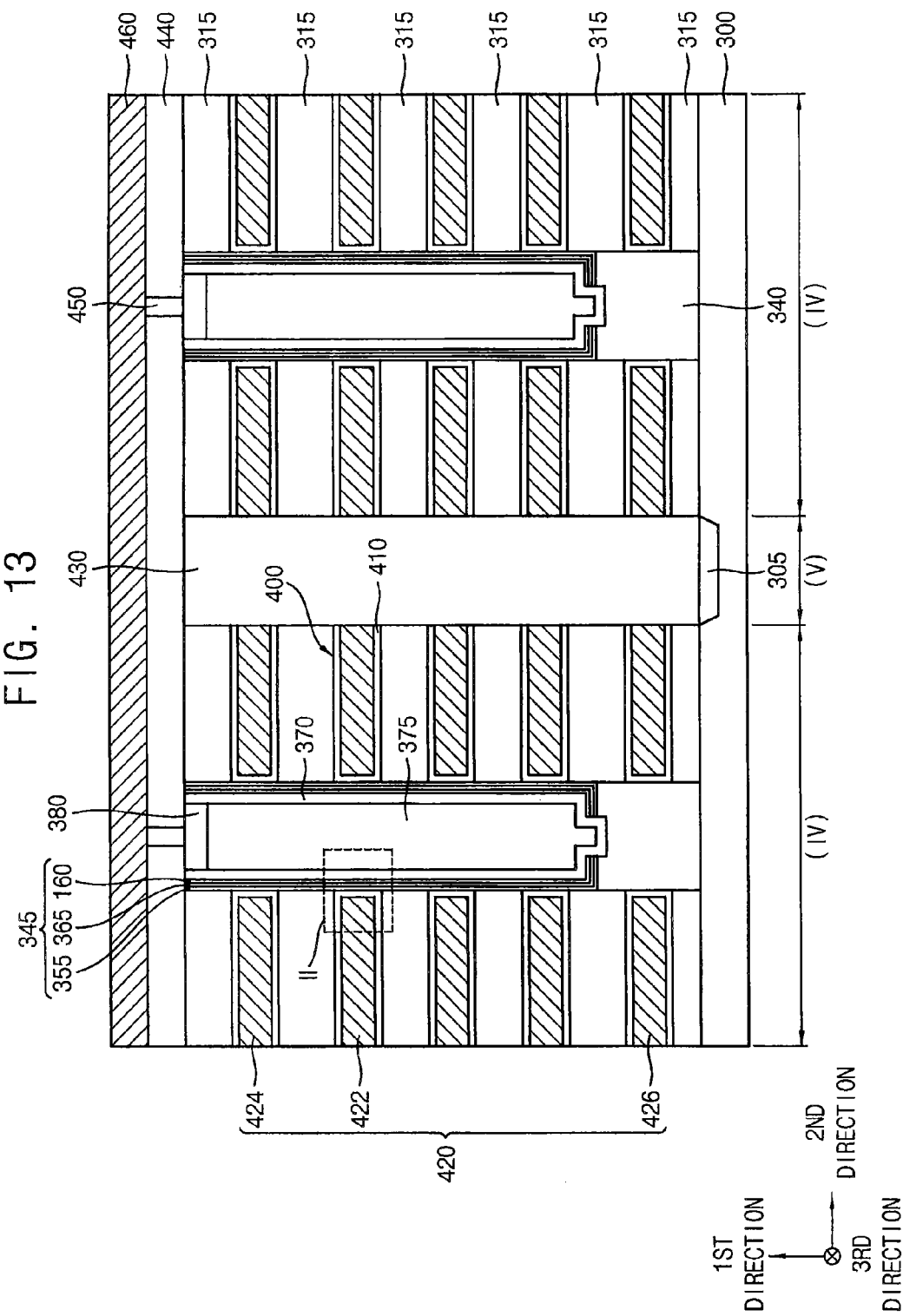

FIG. 12 is a cross-sectional view illustrating a vertical memory device in accordance with example embodiments, and FIG. 13 is a cross-sectional view illustrating a vertical memory device in accordance with example embodiments. Further, FIG. 14 is an enlarged cross-sectional view of region II of FIG. 13.

In all figures in this specification, a direction substantially perpendicular to a top surface of the substrate is referred to as a first direction, and two directions substantially parallel to the top surface of the substrate and substantially perpendicular to each other are referred to as a second direction and a third direction. Further, a fourth direction is substantially parallel to the top surface of the substrate and at an acute angle to the third direction. Additionally, a direction indicated by an arrow in the figures and a reverse direction thereto are considered as the same direction.

Figure 14:
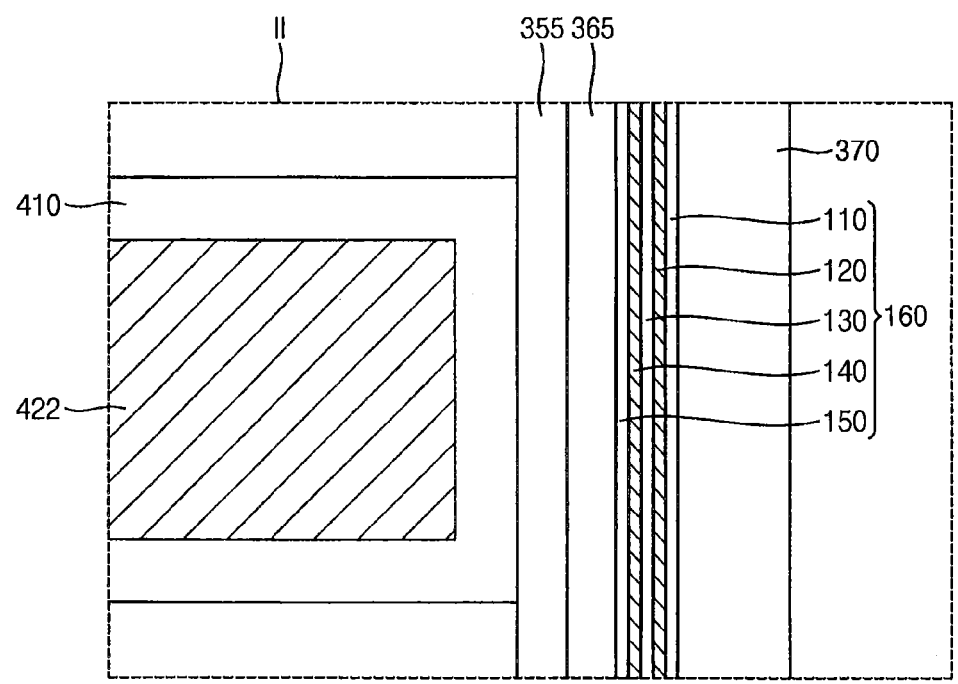

Referring to FIGS. 12 to 14, the vertical memory device may include a plurality of channels 370 each of which may extend in the first direction on a substrate 300, a charge storage structure 345 stacked on an outer sidewall of each channel 370, and a plurality of gate electrodes 422, 424 and 426 disposed on an outer sidewall of the charge storage structure 345. The vertical memory device may further include a bit line contact 450, a bit line 460 and a first insulation layer pattern 315 disposed between the gate electrodes 422, 424 and 426.

The substrate 300 may include a semiconductor material, e.g., silicon, germanium, etc. The substrate 300 may include a first region IV and a second region V. In example embodiments, the first region IV may be a cell region in which vertical memory elements including the channels 370 may be formed, and the second region V may be a word line cut region to insulate and separate the gate electrodes 422, 424 and 426. A plurality of first regions I and a plurality of second regions II may be disposed alternately and repeatedly in the second direction, and each of the first regions I and the second regions II may extend in the third direction.

Each channel 370 may extend in the first direction in the first region IV. In some example embodiments, each channel 370 may have a cup shape of which a central bottom is opened. In this case, a space defined by an inner wall of each channel 370 may be filled with an insulation pattern 375. In some example embodiments, each channel 370 may have a pillar shape. For example, each channel 370 may include doped or undoped polysilicon or single crystalline silicon.

In example embodiments, the plurality of channels 370 may be arranged in both of the second and third directions. The plurality of channels 370 may be arranged in a zigzag pattern (that is, a staggered pattern) with respect to the third direction, and thus a channel array including more channels may be arranged in a given area.

Referring now to FIGS. 13 and 14, the charge storage structure 345 disposed on the outer sidewall of each channel 370 may include a tunnel insulation layer structure 160, a charge storage layer pattern 365 and a first blocking layer pattern 355 which may be stacked sequentially. Particularly, the tunnel insulation layer structure 160, the charge storage layer pattern 365 and the first blocking layer pattern 355 may surround the outer sidewall and a bottom surface of each channel 370. In example embodiments, a plurality of charge storage structures 345 may be disposed to correspond to respective channels 370.

In example embodiment, the tunnel insulation layer structure 160 may be substantially identical to the tunnel insulation layer structure 160 described with reference to FIG. 1. That is, the tunnel insulation layer structure 160 may include a first tunnel insulation layer 110, a second tunnel insulation layer 120, a third tunnel insulation layer 130, a fourth tunnel insulation layer 140 and a fifth tunnel insulation layer 150 which may be stacked sequentially on outer sidewall and a bottom surface of each channel 370. Alternatively, the tunnel insulation layer structure 160 may be substantially identical to those described with reference to FIG. 2, FIG. 3 or FIG. 4.

In example embodiments, the charge storage layer pattern 365 may include a nitride, e.g., silicon nitride, and the first blocking layer pattern 355 may include an oxide, e.g., silicon oxide.

On the other hand, a semiconductor pattern 340 making contact with the top surface of the substrate 300 may be formed beneath each channel 370. According as the channel 370 may have the portion at a bottom thereof protruding from the charge storage layer structure 345, the semiconductor pattern 340 may have a concave portion at a top surface thereof. That is, the semiconductor pattern 340 may directly contact the channel 370 through the protrusion portion thereof. For example, the semiconductor pattern 340 may include doped or undoped polysilicon, single crystalline polysilicon, doped or undoped polygermanium or single crystalline germanium.

Additionally, a pad 380 may be formed on top surfaces of the channel 370 and the charge storage layer structure 345. In example embodiments, the pad 380 may include doped or undoped polysilicon or single crystalline silicon. As the plurality of channels 370 may constitute the channel array, a plurality of pads 180 may also constitute pad arrays.

Referring to FIGS. 13 and 14, a plurality of first insulation layer patterns 315 may be formed in the first direction on sidewalls of the first blocking layer patterns 355, respectively. For example, each first insulation layer pattern 315 may include silicon oxide. Further, a space between the first insulation layer patterns 315 at each level may be defined as a gap 400.

The second blocking layer pattern 410 may surround a sidewall of the first blocking layer pattern 355 exposed by the gap 400, that is, may surround an outer sidewall of the channel 370. Thus, portions of the outer sidewalls of the channels 370 may be surrounded by the second blocking layer pattern 410. The second blocking layer pattern 410 may be further formed on an inner wall of the gap 400. Top and bottom end portions of the second blocking layer pattern 410 may extend in both of the second and third directions. The second blocking layer pattern 410 may include an insulation material, e.g., aluminum oxide and/or silicon oxide. Alternatively, the second blocking layer pattern 410 may be omitted.

The plurality of gate electrodes 422, 424 and 426 may be formed on a sidewall of the second blocking layer pattern 410 and may fill an inner portion of the gap 400. In example embodiments, the plurality of gate electrodes 422, 424 and 426 disposed in the first region IV may extend in the third direction.

The plurality of gate electrodes 422, 424 and 426 may include a ground selection line (GSL) 426, a word line 422 and a string selection line (SSL) 424 that are spaced apart from each other along the first direction.

Each of the GSL 426, the word line 422 and the SSL 424 may be at a single level (e.g., one of each, each at a different height) or more than one level, and each of the first insulation layer patterns 315 may be interposed therebetween. In an example embodiments, the GSL 426 and the SSL 424 may be at one level (e.g., two of each at different heights), respectively, and the word line 422 may be at 4 levels between the GSL 426 and the SSL 424. However, the GSL 426 and the SSL 424 may be at two levels, and the word line 422 may be formed at 2, 8, 16, 24, 32 or 64 levels.

In example embodiments, the plurality of gate electrodes 422, 424 and 426 may include, for example, a metal and/or a metal silicide. For example, the plurality of gate electrodes 422, 424 and 426 may include a metal and/or a metal silicide with low electrical resistance (e.g., tungsten, titanium, tantalum, and/or nickel silicide.)

Accordingly, the channel 370, the charge storage layer structure 345 and the plurality of gate electrodes 422, 424 and 426 may define a memory cell. A plurality of memory cells may be formed in the first direction along the channel 370.

Referring now to FIG. 13, a first impurity region 305 and a fourth insulation layer pattern 430 may be disposed in the second region V on the substrate 300.

The first impurity region 305 may be disposed at an upper portion of the substrate 300 in the second region. In example embodiments, the first impurity region 305 may include n-type impurities, for example, phosphorus and/or arsenic. The impurity region 305 may extend in the third direction and serve as a common source line (CSL).

The fourth insulation layer pattern 430 may be disposed in the second region V of the substrate 300 between the gate electrodes 422, 424 and 426. That is, the fourth insulation layer pattern 430 may separate and isolate the gate electrodes 422, 424 and 426 in one first region IV from other gate electrodes 422, 424 and 426 in another first region IV.

Further, the bit line 460 may be electrically connected to the channels 370 and the pads 380 through the bit line contact 450. For example, the bit line 460 may include a metal, a metal nitride or a doped polysilicon. In example embodiments, a plurality of bit lines 460 may be arranged in the third direction, and each of the bit lines 460 may extend in the second direction.

According to example embodiments, the vertical memory device may include the channel 370 extending in the first direction, and the tunnel insulation layer structure 160 surrounding the outer sidewall of the channels 370. As mentioned above, the tunnel insulation layer structure 160 may include at least four tunnel insulation layers, preferably five tunnel insulation layers. Further, the shallow trap site may be reduced or removed from the tunnel insulation layer structure 160. Therefore, an initial voltage shift problem of the vertical memory device may be resolved or reduced.

Figure 15:
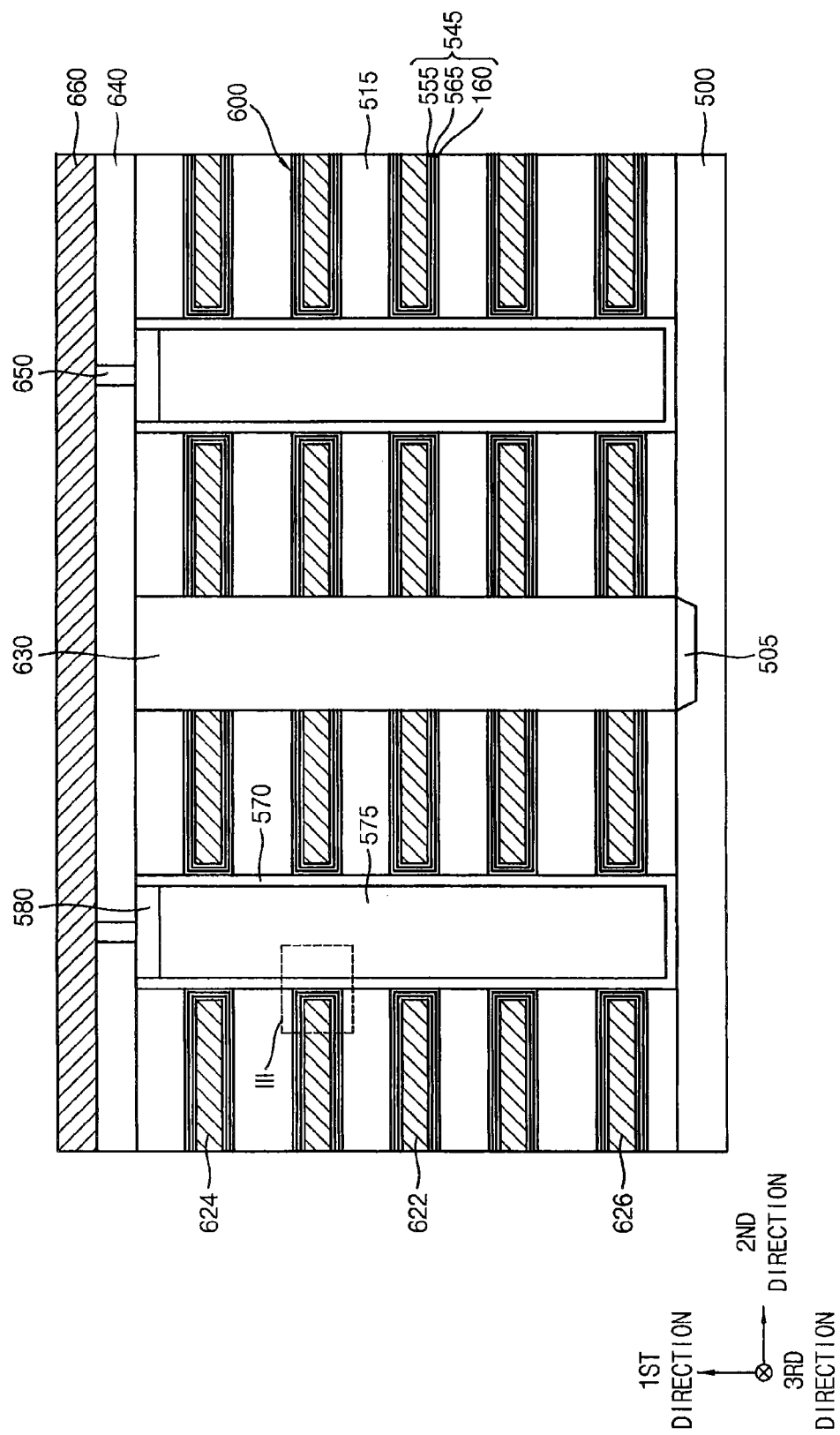
Figure 16:
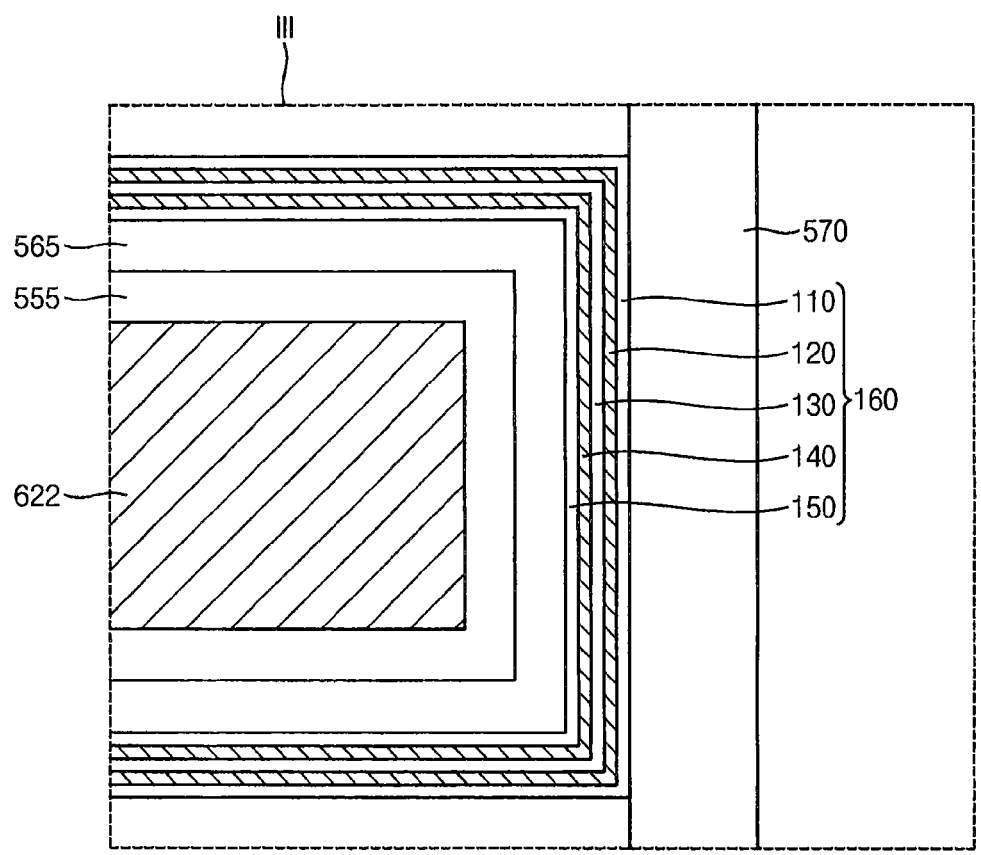

FIG. 15 is a cross-sectional view illustrating a vertical memory device in accordance with some example embodiments, and FIG. 16 is an enlarged cross-sectional view of region III of FIG. 15. The vertical memory device of FIGS. 15 and 16 may be substantially similar to the vertical memory device described with reference to FIGS. 12 to 14 except for the a charge storage layer structure 545 and a semiconductor pattern.

Referring to FIGS. 15 and 16, the vertical memory device may include a plurality of channels 570 each of which may extend in the first direction on a substrate 500, a plurality of gate electrodes 622, 624 and 626 partially surrounding an outer sidewall of the channel 570, and a charge storage structure 545 between the channel 570 and the gate electrodes 622, 624 and 626. The vertical memory device may further include a bit line contact 650, a bit line 660 and a pad 580.

A plurality of first insulation layer patterns 515 may be formed in the first direction on sidewalls of the channels 570, respectively. Further, a space between the first insulation layer patterns 515 at each level may be defined as a gap 600.

The charge storage layer structure 545 may surround a sidewall of the channel 570 exposed by the gap 600, and may be further formed on an inner wall of the gap 600. In example embodiments, the charge storage layer structure 545 may include a tunnel insulation layer structure 160, a charge storage layer pattern 565 and a blocking layer pattern 555.

In example embodiment, the tunnel insulation layer structure 160 may be substantially identical to the tunnel insulation layer structure 160 described with reference to FIG. 1. That is, the tunnel insulation layer structure 160 may include a first tunnel insulation layer 110, a second tunnel insulation layer 120, a third tunnel insulation layer 130, a fourth tunnel insulation layer 140 and a fifth tunnel insulation layer 150 which may be stacked sequentially. Alternatively, the tunnel insulation layer structure 160 may be substantially identical to those described with reference to FIG. 2, FIG. 3 or FIG. 4.

In example embodiments, the charge storage layer pattern 565 may include a nitride, e.g., silicon nitride, and the first blocking layer pattern 555 may include an oxide, e.g., silicon oxide.

According to example embodiments, the vertical memory device may include the channel 570 extending in the first direction, and the tunnel insulation layer structure 160 surrounding the outer sidewall of the channels 570. As mentioned above, the tunnel insulation layer structure 160 may include at least four tunnel insulation layers, preferably five tunnel insulation layers. Further, the shallow trap site may be reduced or removed from the tunnel insulation layer structure 160. Therefore, an initial voltage shift problem of the vertical memory device may be resolved or reduced.

FIGS. 17 to 23 are cross-sectional views illustrating a method of manufacturing a vertical memory device in accordance with example embodiments.

FIGS. 17 to 23 are cross-sectional views illustrating a method of manufacturing a vertical memory device in accordance with example embodiments. The figures show methods of manufacturing the vertical memory device of FIGS. 12 to 14, however, may not be limited thereto.

Figure 17:
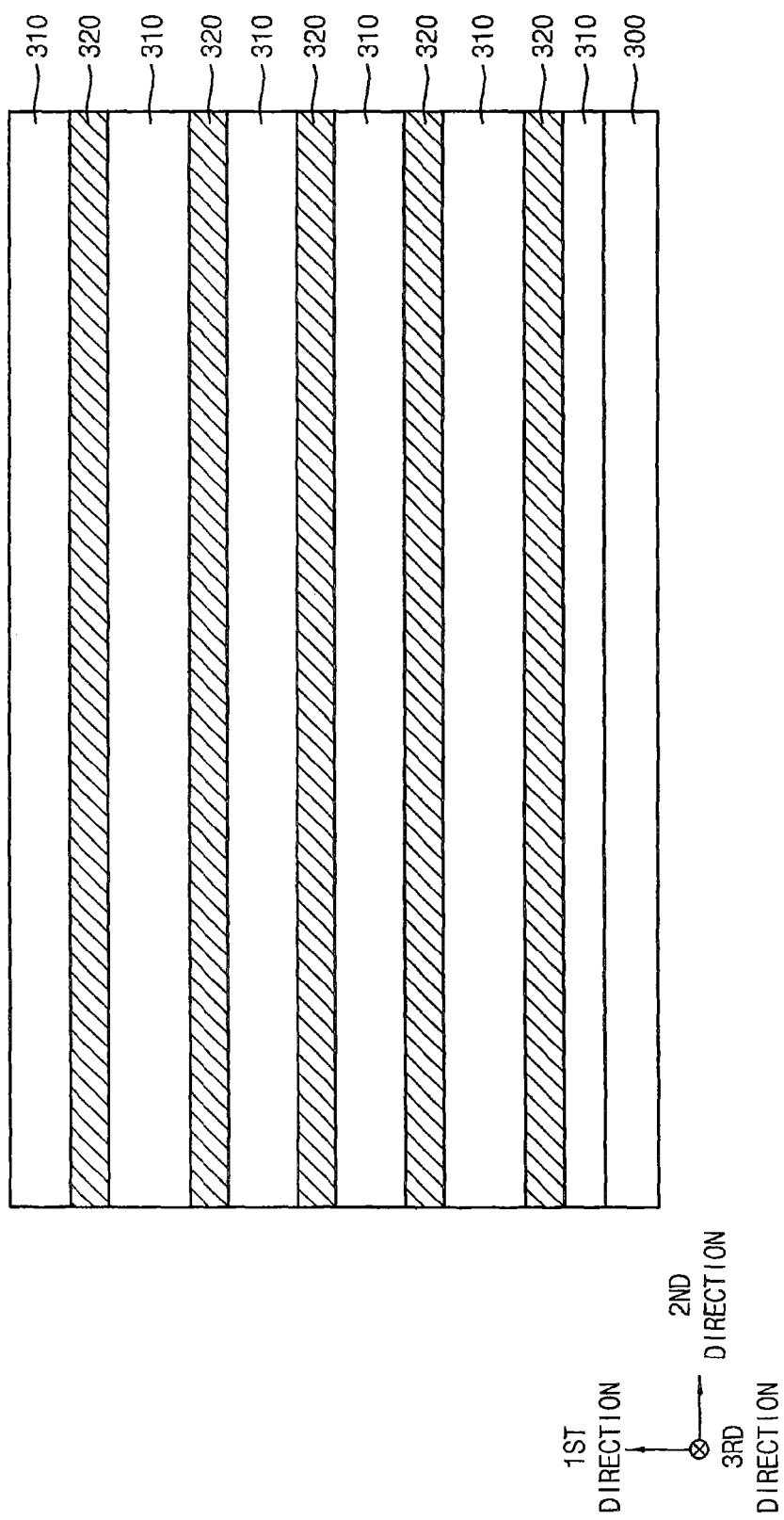

Referring to FIG. 17, a first insulation layer 310 and a sacrificial layer 320 may be alternately and repeatedly formed on a substrate 300. A plurality of first insulation layers 310 and a plurality of sacrificial layers 320 may be alternately formed on each other at a plurality of levels, respectively.

In example embodiments, the first insulation layer 310 and the sacrificial layer 320 may be formed by, for example, a chemical vapor deposition (CVD) process, a plasma enhanced chemical vapor deposition (PECVD) process and/or an atomic layer deposition process (ALD) process. A lowermost first insulation layer 310, which may be formed directly on a top surface of the substrate 300, may be formed by, for example, a thermal oxidation process.

In example embodiments, the first insulation layer 310 may be formed to include a silicon oxide. The sacrificial layers 320 may be formed to include, for example, a material with etch selectivity to the first insulation layer 310 (e.g., silicon nitride).

Figure 23:
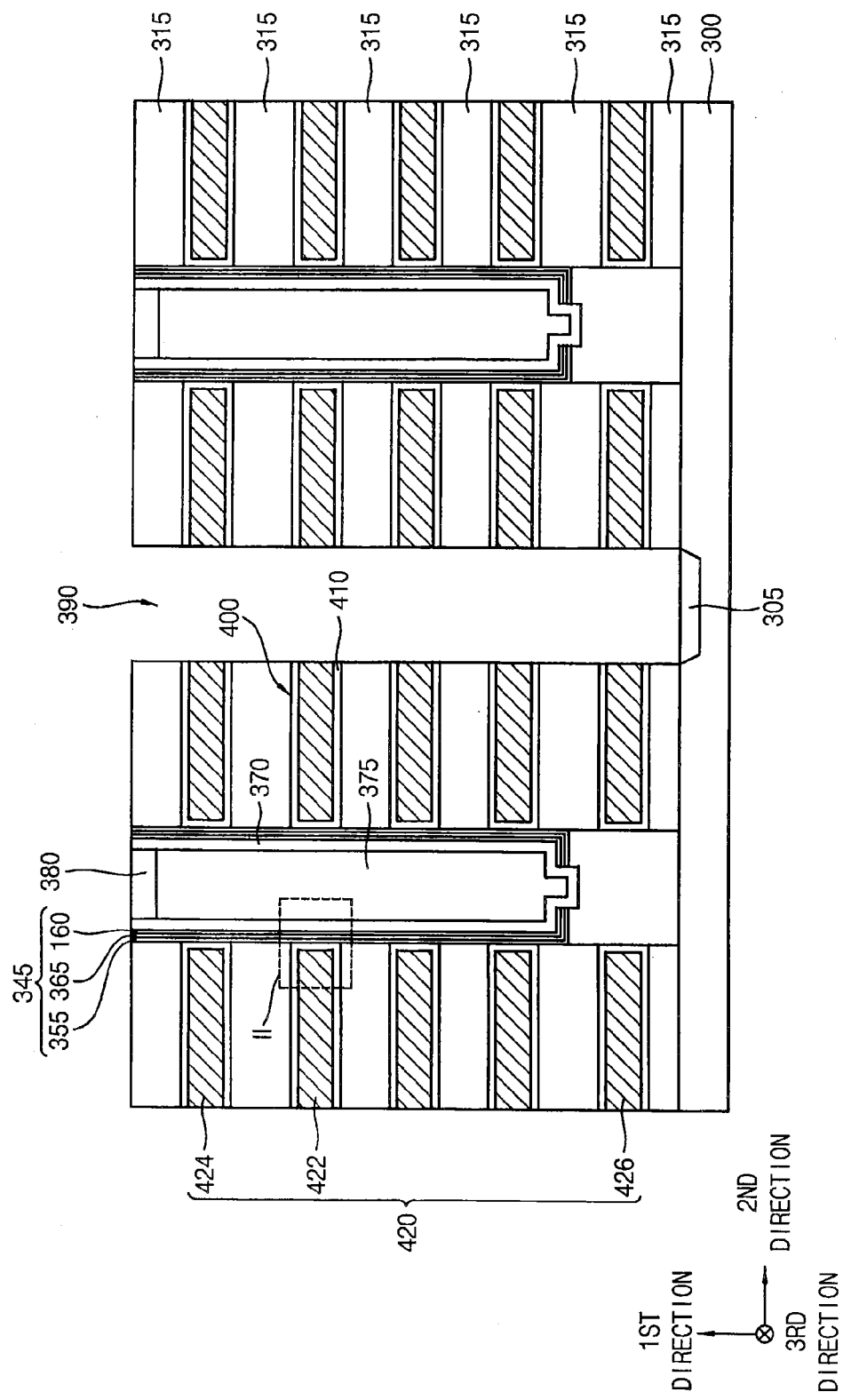

The number of the first insulation layers 310 and the number of the sacrificial layers 320 stacked on the substrate 300 may vary according to the desired number of a GSL 426, a word line 422 and a SSL 424 (refer to FIG. 23).

Figure 18:
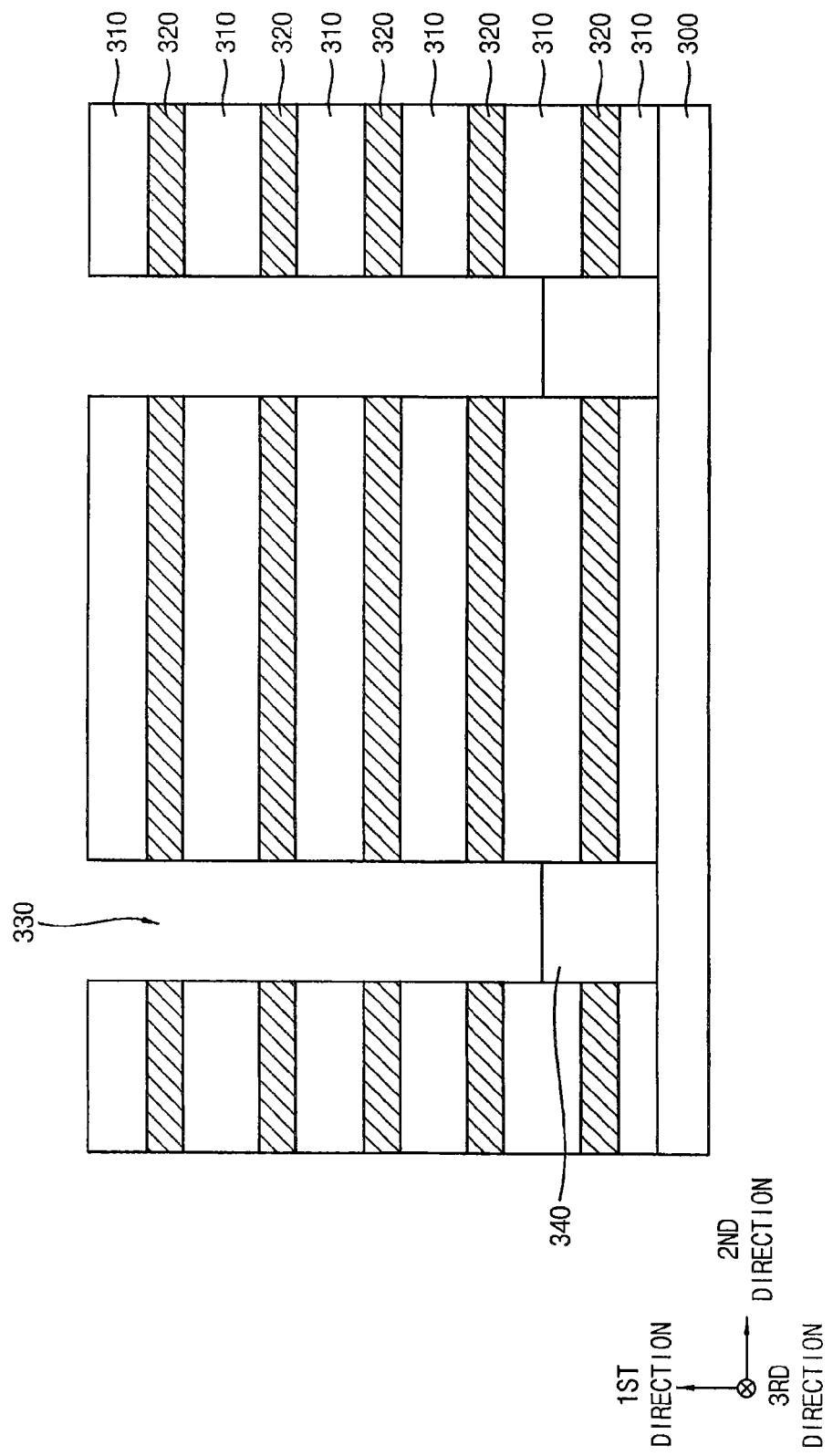

Referring to FIG. 18, a plurality of holes 330 may be formed through the first insulation layers 310 and the sacrificial layers 320 to expose a top surface of the substrate 300, and a semiconductor pattern 340 may be formed on the substrate 300 to partially fill the holes 330.

In example embodiments, after forming a hard mask on the uppermost first insulation layer 310, the first insulation layers 310 and the sacrificial layers 320 may be dry etched using the hard mask as an etch mask to form the holes 330.

In example embodiments, a plurality of holes 330 may be arranged in the second direction and the third direction. For example, the plurality of holes 330 may be arranged in a zigzag pattern with respect to the third direction, thereby forming a hole array.

Then, a selective epitaxial growth (SEG) process may be performed using the exposed top surface of the substrate 300 as a seed to form the semiconductor pattern 340. Alternatively, an amorphous silicon layer may be formed to fill the holes 330, and a laser epitaxial growth (LEG) process or a solid phase epitaxial (SPE) process may be performed on the amorphous silicon layer to form the semiconductor pattern 340. In example embodiments, the semiconductor pattern 340 may be formed to have a top surface higher than that of the sacrificial layer 320, in which the GSL 426 (See FIG. 23) may be formed subsequently.

Figure 19:
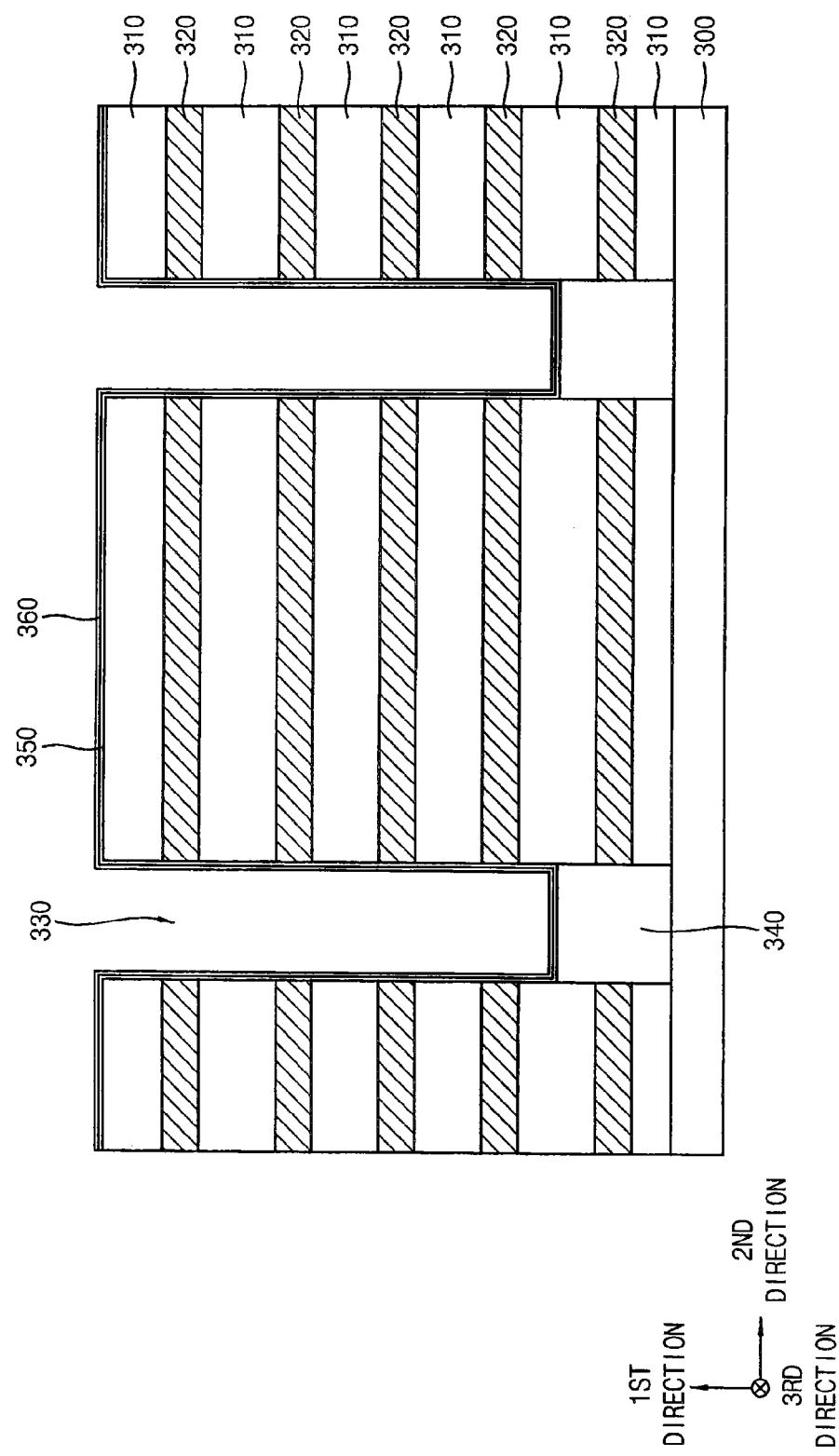

Referring to FIG. 19, a first blocking layer 350 and a charge storage layer 360 may be sequentially formed on an inner wall of the holes 330, a top surface of the semiconductor pattern 340, and a top surface of the uppermost first insulation layer 310.

In example embodiments, the first blocking layer 350 may be formed to include an oxide, e.g., silicon oxide, the charge storage layer 360 may be formed to include a nitride, e.g., silicon nitride, and the tunnel insulation layer may be formed to include an oxide, e.g., silicon oxide.

Figure 20:
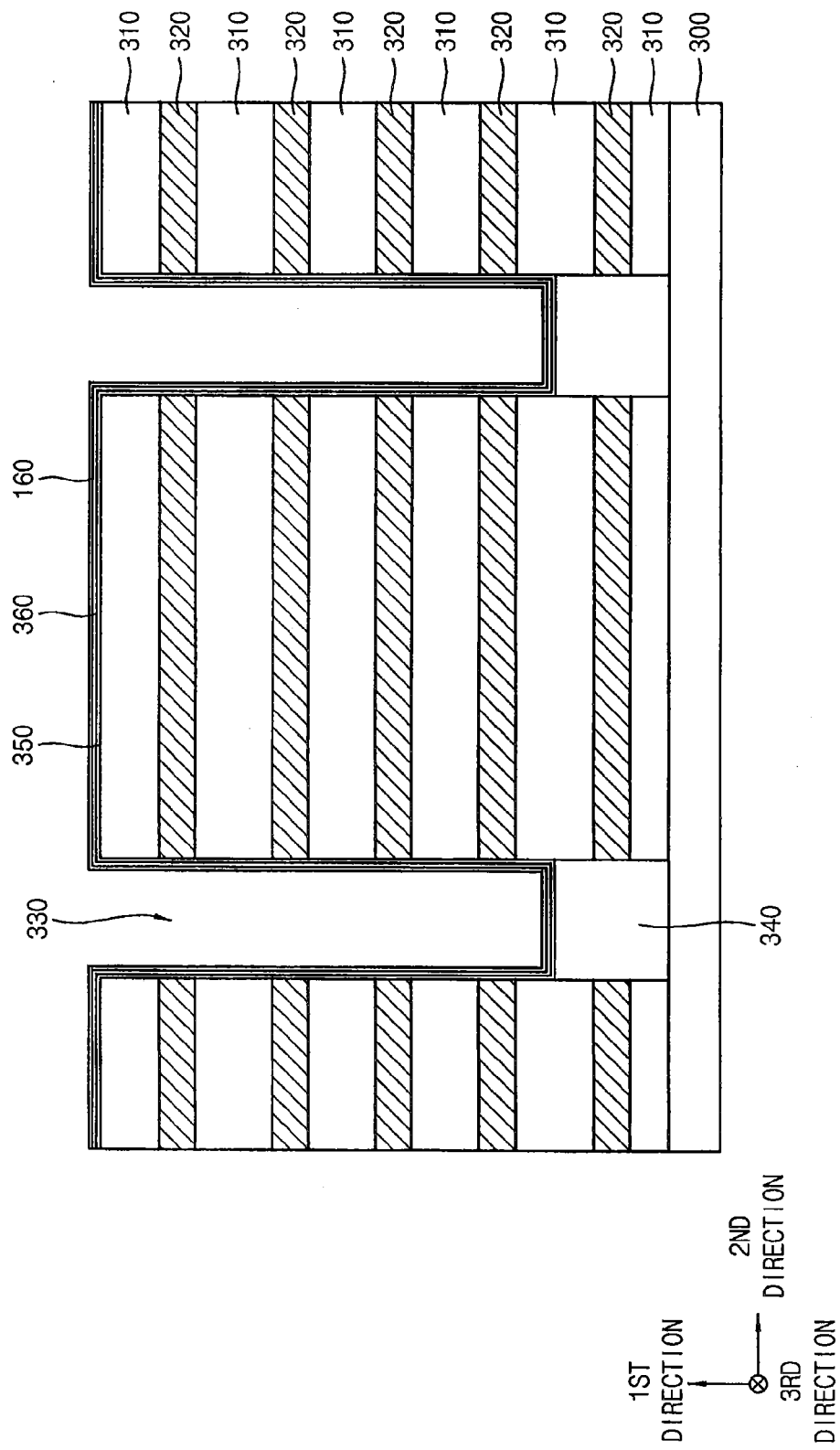

Referring to FIG. 20, a tunnel insulation layer structure 160 may be formed on the charge storage layer 360.

In example embodiments, processes for forming the tunnel insulation layer structure 160 may be substantially identical to or similar to those described with reference to FIGS. 5 to 8. However, the second tunnel insulation layer 120 and the fourth tunnel insulation layer 140 may be formed by an ALD process. When the second and the fourth tunnel insulation layers 120 and 140 are formed by the ALD process, each of the second and the fourth tunnel insulation layers 120 and 140 may have an uniform thickness on the inner wall of the hole 330 having a relatively high aspect ratio.

Figure 21:
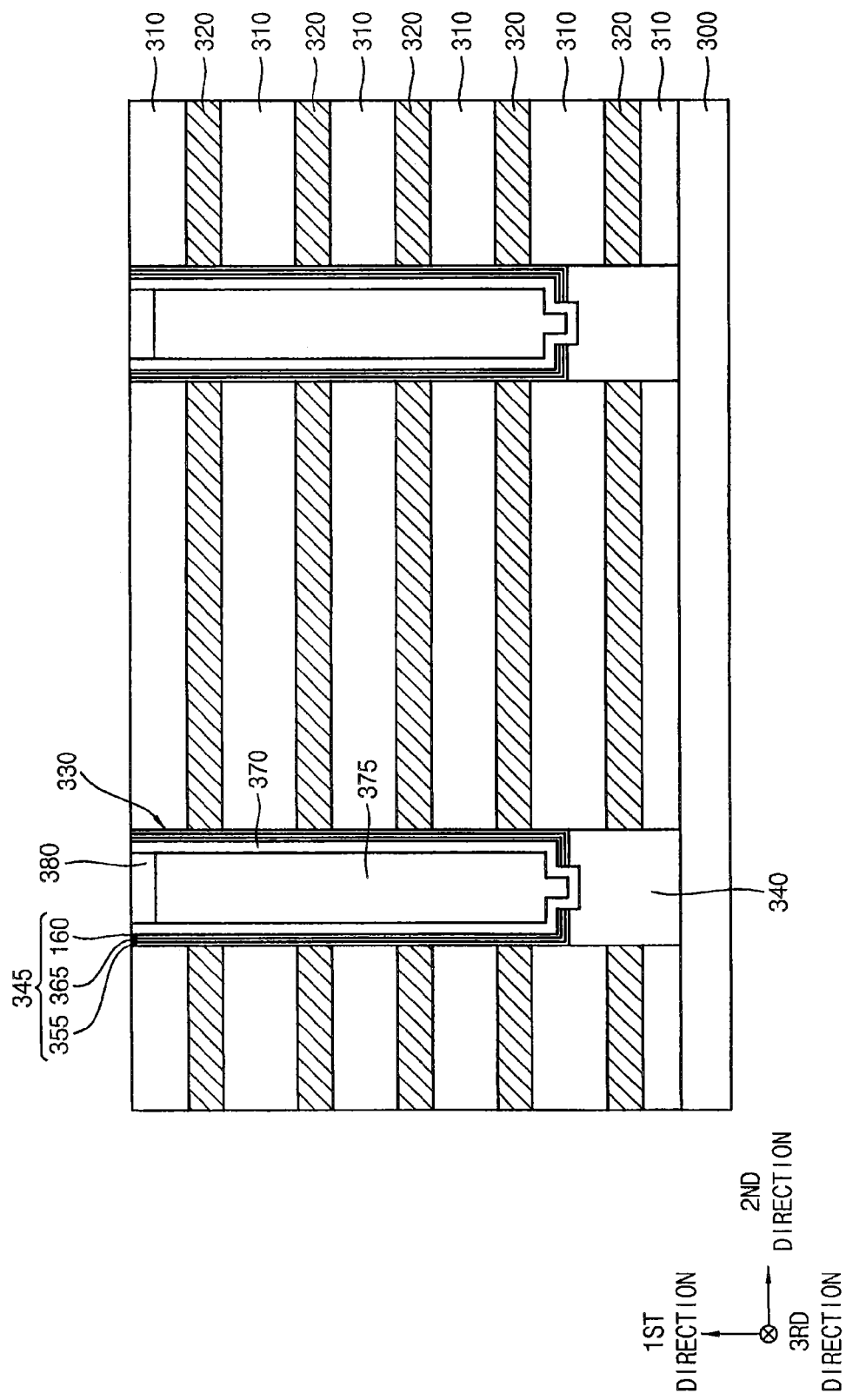

Referring to FIG. 21, channels 370, second insulation layer patterns 375 and pads 180 may be formed to fill the holes 330.

Particularly, bottom portion of the first blocking layer 350, the charge storage layer 360 and the tunnel insulation layer structure 160 and an upper portion of the semiconductor pattern 340 may be partially removed to form a recess. A channel layer and a second insulation layer may be formed to sufficiently fill the recess and a remaining portion of each hole 330, and then upper portions of the first blocking layer 350, the charge storage layer 360, the tunnel insulation layer structure 160, the second insulation layer and the channel layer may be removed to form charge storage layer structure 345, the channels 370 and the second insulation layer pattern 375. Therefore, the charge storage layer structure 345 may include a first blocking layer pattern 355, a charge storage layer pattern 365 and a tunnel insulation layer structure 160.

Then, upper portions of the first blocking layer pattern 355, the charge storage layer pattern 365, the tunnel insulation layer structure 160, the channels 370 and the second insulation layer patterns 172 may be partially removed to form a recess, and the pad 380 may be formed to fill the recess. For example, the pad 380 may include a metal, a conductive metal nitride, doped polysilicon, and the like.

Figure 22:
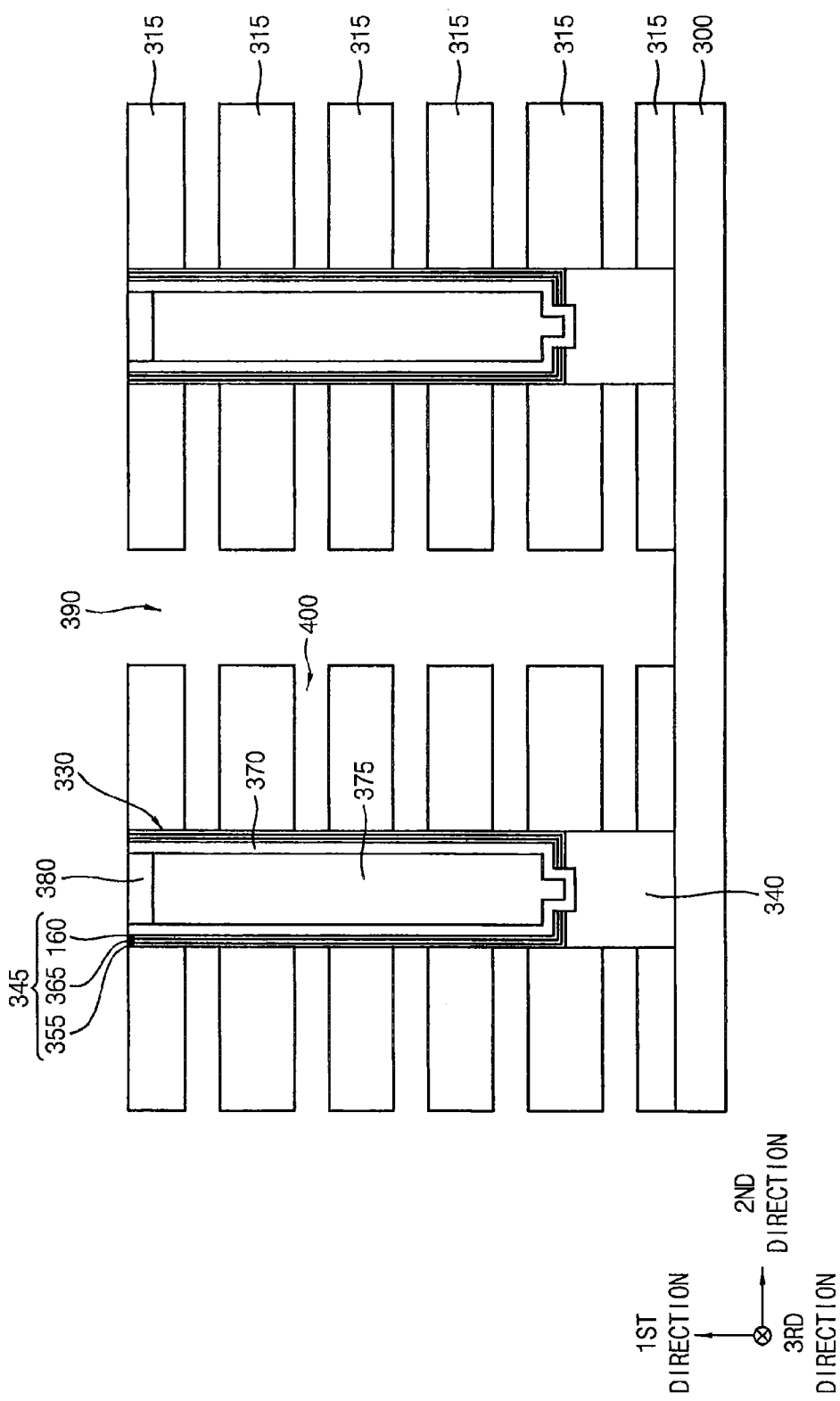

Referring to FIG. 22, an opening 390 may be formed through the first insulation layers 310 and the sacrificial layers 320 to expose a top surface of the substrate 300, and then the sacrificial layer 320 may be removed to form a gap 400 between the first insulation layer patterns 315 at adjacent levels.

In example embodiments, the opening 390 may extend in the third direction. As the opening 390 may be formed, the first insulation layer 310 may be transformed into a first insulation layer pattern 315. A plurality of first insulation layer patterns 115 may be formed in the second direction at each level, and each first insulation layer pattern 315 may extend in the third direction.

Then, the sacrificial layer 320 may be removed by a wet etching process. Particularly, the sacrificial layer 320 exposed by the opening 390 may be removed by a wet etching process using phosphoric acid or sulfuric acid as a etching solution. Therefore, portions of the outer sidewall of the charge storage layer structure 345 may be exposed by the gap 400.

Referring to FIG. 23, a second blocking layer patterns 410 and gate electrodes 422, 424 and 426 may be formed to fill the gaps 400.

Particularly, a second blocking layer and a gate electrode layer may be formed on the exposed portion of the outer sidewall of the charge storage layer structure 345, the exposed portion of the sidewall of the semiconductor pattern 340, an inner sidewall of the gap 400, a surface of the first insulation layer pattern 315, the exposed top surface of the substrate 300 and top surfaces of the pad 380. For example, the gate electrode layer may be formed to include a metal of a low resistance, e.g., tungsten, titanium, tantalum, platinum, and the like or metal silicide e.g. nickel silicide. Then, the second blocking layer the gate electrode layer may be partially removed to form a plurality of gate electrodes 422, 424 and 426. Further, an impurity region 305 may be formed at the upper portion of the substrate 300. In example embodiments, the plurality of gate electrodes 420 may fill the gap 400.

Accordingly, the channels 370, the charge storage layer structure 345 and the word lines 442 may constitute a memory cell.

Then, a fourth insulation layer pattern may be formed to fill the opening 390, and a contact and a bit line may be formed.

Figure 24:
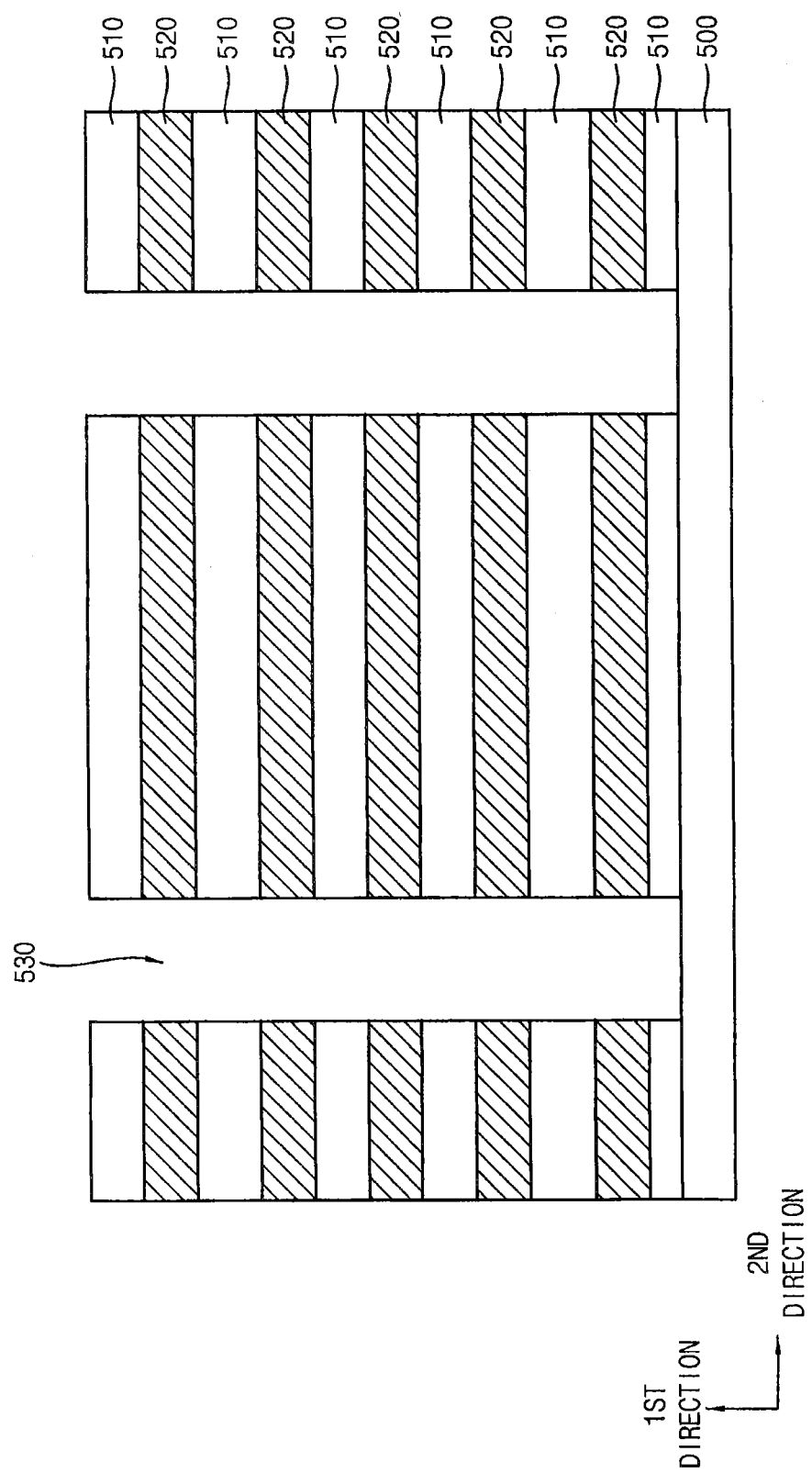

FIGS. 24 to 29 are cross-sectional views illustrating a method of manufacturing a vertical memory device in accordance with example embodiments;

Referring to FIG. 24, a first insulation layer 510 and a sacrificial layer 520 may be alternately and repeatedly formed on a substrate 500, and then a plurality of holes 530 may be formed through the first insulation layers 510 and the sacrificial layers 520. The above processes may be substantially identical to those described with reference to FIGS. 17 and 18.

Figure 25:
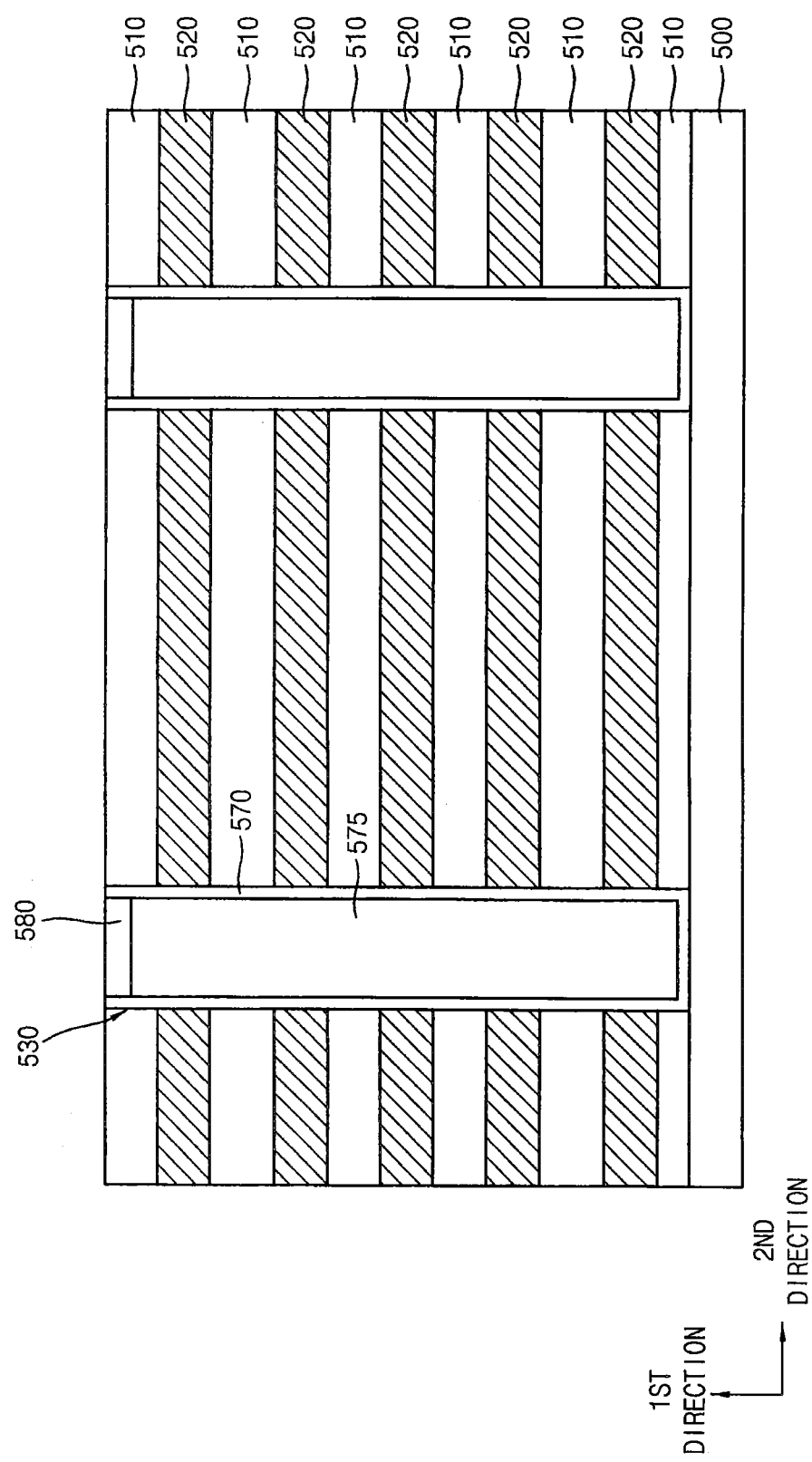

Referring to FIG. 25, a channel 570, a second insulation layer pattern 575 and a pad 580 may be formed to fill the hole 530.

Particularly, a channel layer and a second insulation layer may be formed on an inner wall of the holes 530 and the first insulation layer 510, and then upper portions of the channel layer and the second insulation layer may be removed to form the channel 570 and the second insulation layer pattern 570.

Then, the channel 570 and/or the second insulation layer pattern 575 may be partially removed to form a recess, and the pad 580 may be formed to fill the recess.

Figure 26:
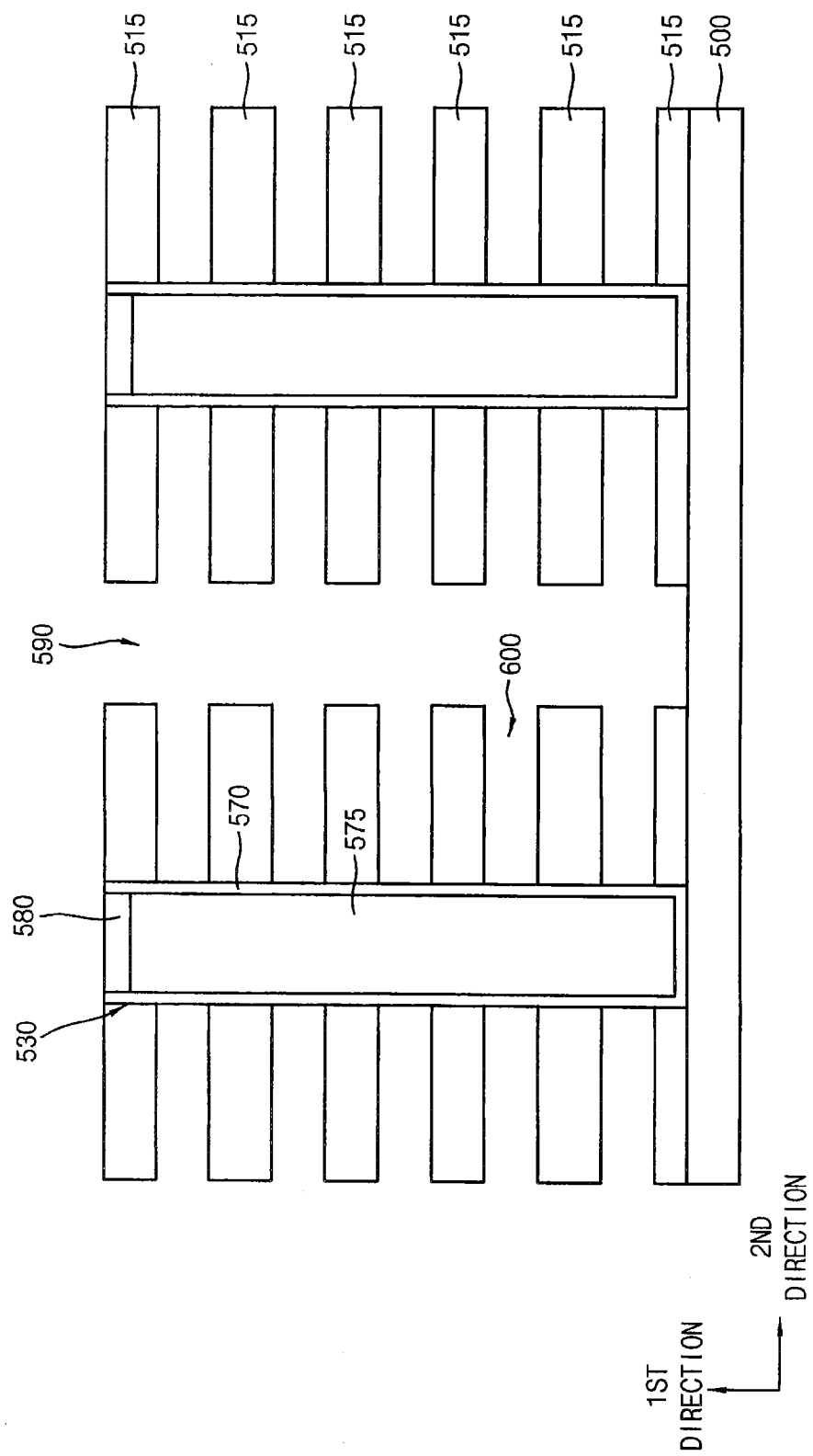

Referring to FIG. 26, an opening 590 may be formed through the first insulation layers 510 and the sacrificial layers 520 to expose a top surface of the substrate 500, and then the sacrificial layer 520 may be removed to form a gap 600 between the first insulation layer patterns 515 at adjacent levels. The processes may be substantially identical to those described with reference to FIG. 22.

Figure 27:
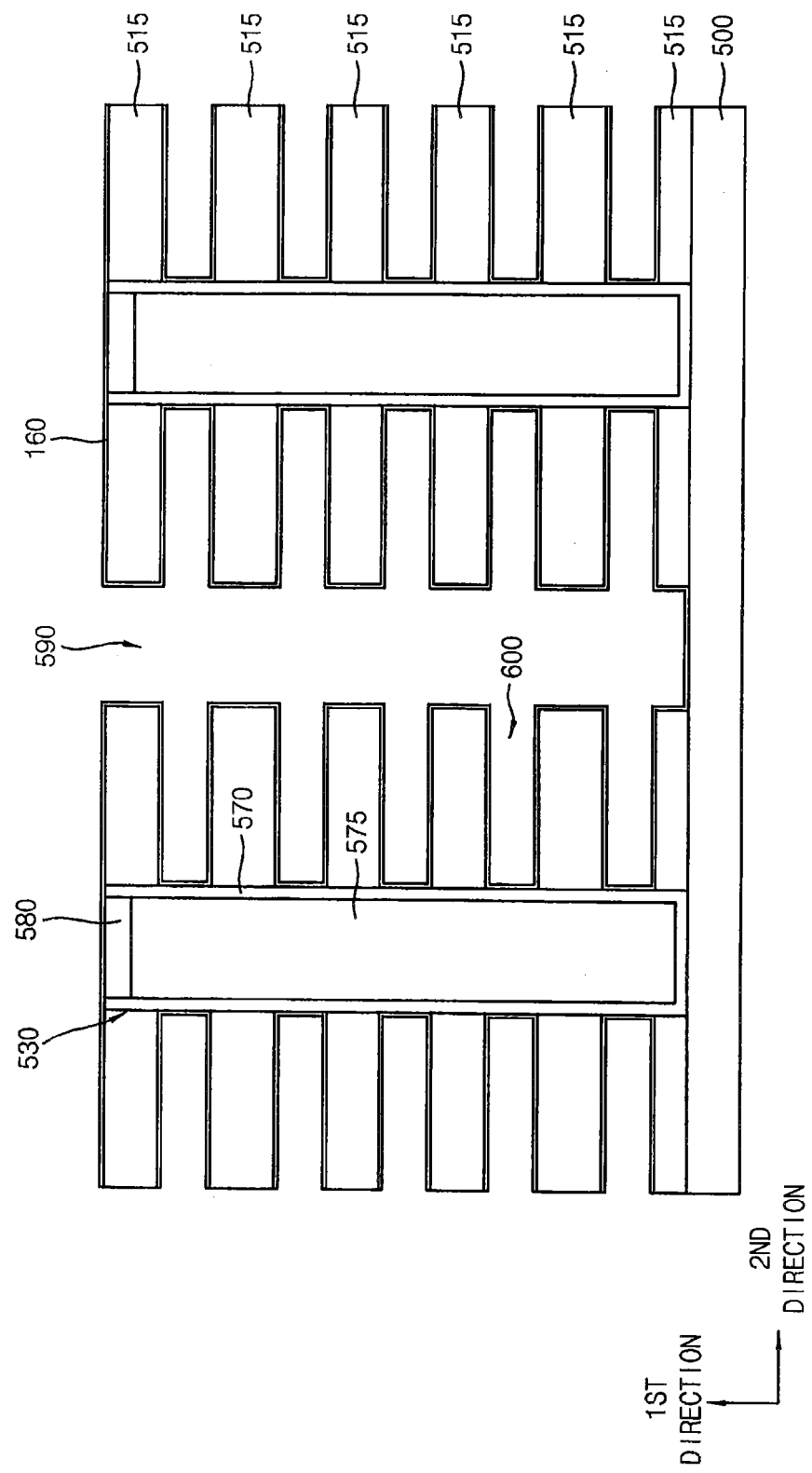

Referring to FIG. 27, a tunnel insulation layer structure 160 may be formed on an exposed sidewall of the channel 570, an inner wall of the gap 600, a surface of the first insulation layer pattern 515, the exposed top surface of the substrate 500, and a top surface of the pad 580.

In example embodiments, the tunnel insulation layer structure 160 may be formed, before forming the charge storage layer 560 which will be described below. Therefore, a curing process or a heat treatment process during the method for forming the tunnel insulation layer structure 160 may not affect the charge storage layer 560.

Figure 28:
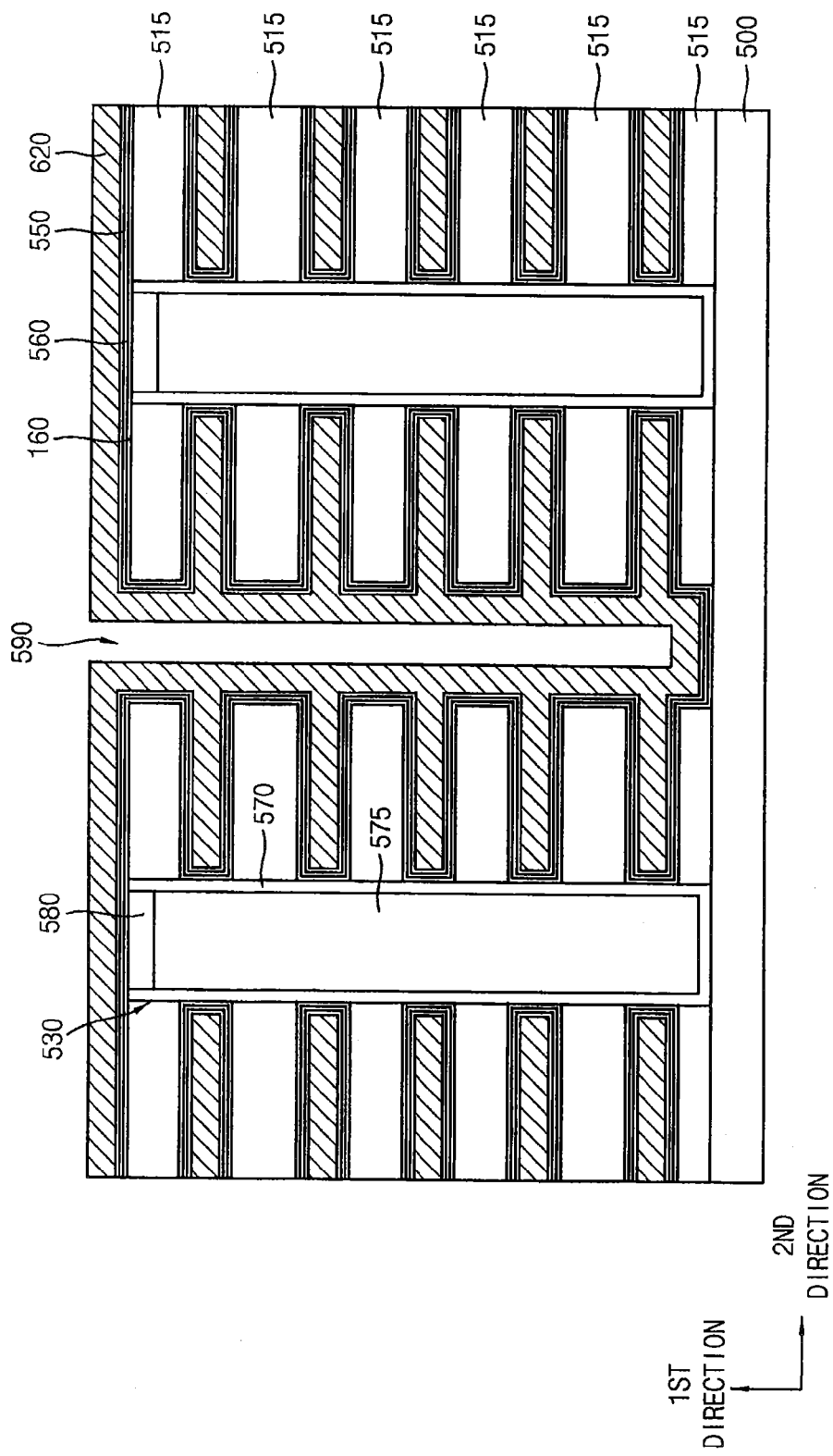

Referring to FIG. 28, a charge storage layer 560, a blocking layer 550 and a gate electrode layer 620 may be sequentially formed to fill the gap 600 and the opening 590. The processes for forming the charge storage layer 560, the blocking layer 550 and the gate electrode layer 620 may be substantially similar to those described with reference to FIGS. 19 to 23.

Figure 29:
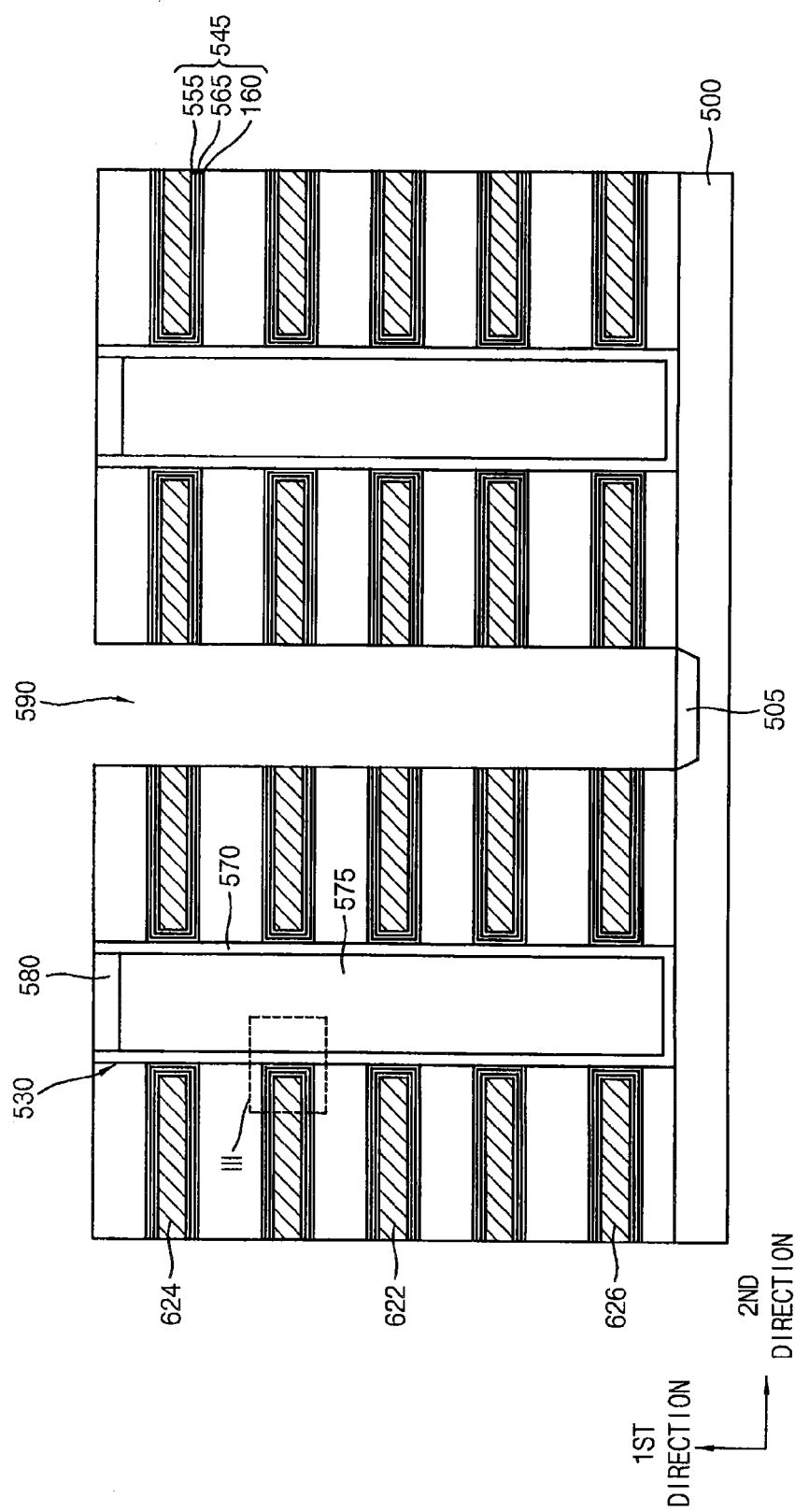

Referring to FIG. 29, the charge storage layer 560, the blocking layer 550 and the gate electrode layer 620 may be partially removed to form the charge storage layer pattern 565, the blocking layer pattern 555 and the gate electrode 622, 624 and 626.

In this case, the plurality of gate electrodes 622, 624 and 626 may include a GSL 626, the word line 622 and the SSL 624 sequentially located from a top surface of the substrate 300. Accordingly, the channels 570, the charge storage layer structure 545 and the word lines 542 may constitute a memory cell.

Then, a fourth insulation layer pattern may be formed to fill the opening 590, and a contact and a bit line may be formed.

Figure 30:
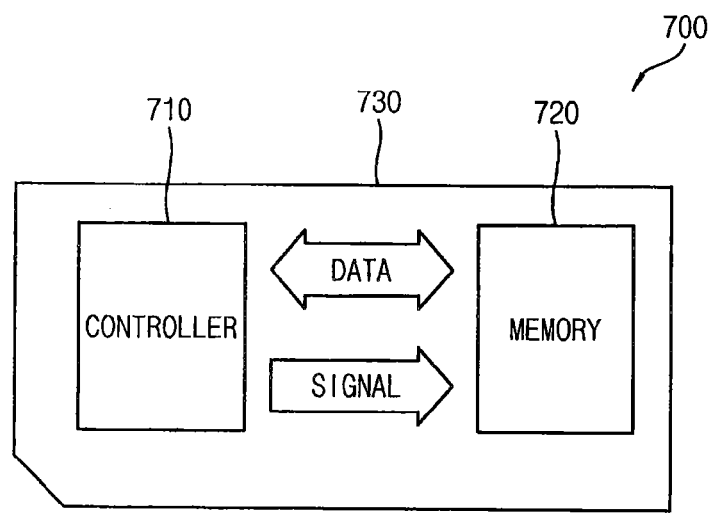

FIG. 30 is a diagram schematically illustrating a memory system 700 according to example embodiments of inventive concept.

Referring to FIG. 30, a controller 710 and a memory 720 may be disposed to exchange electric signals. For example, the memory 720 and the controller 710 may transfer data with each other according to a command of the controller 710. Accordingly, the memory system 700 may store data in the memory 720 or output data from the memory 720.

The memory 720 may include one of the nonvolatile memory devices described with reference to FIGS. 9-16. However, a type of memory device used as the memory 720 is not limited thereto, and may be a dynamic random access memory (DRAM), a static random access memory (SRAM), a flash memory, a phase change RAM (PRAM), or the like.

The memory system 700 may be used for different mobile electronic devices, such as a multi media card (MMC) and a secure digital (SD) card.

Figure 31:
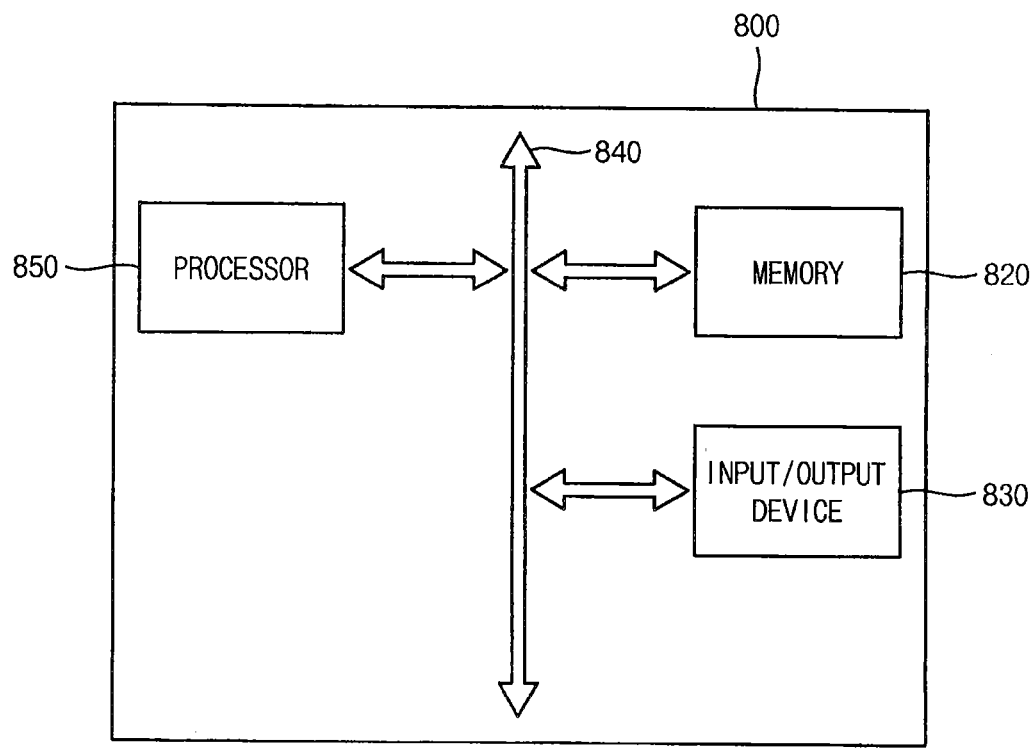

FIG. 31 is a diagram illustrating a system 800 according to example embodiments of inventive concept.

Referring to FIG. 31, a processor 850, an input/output device 830, and a memory 820 may communicate with each other by using a bus 840. The processor 850 may execute a program and control the system 800. The input/output device 830 may input or output data of the system 800. The system 800 may be connected to an external device, such as a personal computer or a network, via the input/output device 830 so as to exchange data with the external device.

The memory 820 may store a code or data for operation of the processor 850. The memory 820 may include one of the nonvolatile memory devices described with reference to FIGS. 9-16. However, a type of memory device used as the memory 820 is not limited thereto, and may include a DRAM, SRAM, a flash memory, a PRAM, or the like.

For example, the system 800 may be used in different mobile electronic devices, such as mobile phones, MP3 players, navigation, solid state disks (SSDs), and household appliances.

The foregoing is illustrative of at least one example embodiment and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as some example embodiments, are intended to be included within the scope of the appended claims. Thus, to the maximum extent allowed by law, the scope is to be determined by the broadest permissible interpretation of the following claims and their equivalents, and shall not be restricted or limited by the foregoing detailed description.

What is claimed is:

1. A tunnel insulation layer structure, comprising:
a first tunnel insulation layer on a substrate, the first tunnel insulation layer having a first band gap energy;
a second tunnel insulation layer on the first tunnel insulation layer, the second tunnel insulation layer having a second band gap energy which is lower than the first band gap energy;
a third tunnel insulation layer on the second tunnel insulation layer, the third tunnel insulation layer having a third band gap energy which is higher than the second band gap energy;
a fourth tunnel insulation layer on the third tunnel insulation layer, the fourth tunnel insulation layer having a fourth band gap energy which is lower than the third band gap energy; and
a fifth tunnel insulation layer on the fourth tunnel insulation layer, the fifth tunnel insulation layer having a fifth band gap energy which is higher than the fourth band gap energy.

2. The tunnel insulation layer structure of claim 1,
wherein the first tunnel insulation layer, the third tunnel insulation layer and the fifth tunnel insulation layer comprise silicon oxide,
and wherein the second tunnel insulation layer and the fourth tunnel insulation layer comprise silicon oxy-nitride.

3. The tunnel insulation layer structure of claim 2, wherein nitrogen concentrations of the second tunnel insulation layer and the fourth tunnel insulation layer are higher than about 20 at %.

4. The tunnel insulation layer structure of claim 1,
wherein the first tunnel insulation layer comprises silicon oxide,
wherein the second tunnel insulation layer, the third tunnel insulation layer, the fourth tunnel insulation layer and the fifth tunnel insulation layer comprise silicon oxy-nitride,
and wherein nitrogen concentrations of the second tunnel insulation layer and the fourth tunnel insulation layer are higher than nitrogen concentrations of the third tunnel insulation layer and the fifth tunnel insulation layer.

5. The tunnel insulation layer structure of claim 4,
wherein the nitrogen concentrations of the second tunnel insulation layer and the fourth tunnel insulation layer are higher than about 20 at %,
and wherein the nitrogen concentrations of the third tunnel insulation layer and the fifth tunnel insulation layer are lower than about 10 at %.

6. The tunnel insulation layer structure of claim 1, wherein a thickness of the third tunnel insulation layer is smaller than a thickness of the second tunnel insulation layer.

7. The tunnel insulation layer structure of claim 1, wherein a thickness of the second tunnel insulation layer is smaller than a thickness of the fourth tunnel insulation layer.

8. The tunnel insulation layer structure of claim 1, further comprising a sixth tunnel insulation layer between the fourth tunnel insulation layer and the fifth tunnel insulation layer, wherein the sixth tunnel insulation layer has a sixth band gap energy which is higher than the fourth band gap energy and lower than the fifth band gap energy.

9. A method of manufacturing a tunnel insulation layer structure, the method comprising:
forming a first tunnel insulation layer on a substrate, the first tunnel insulation layer having a first band gap energy;
forming a second tunnel insulation layer on the first tunnel insulation layer, the second tunnel insulation layer having a second band gap energy which is lower than the first band gap energy;
forming a third tunnel insulation layer on the second tunnel insulation layer, the third tunnel insulation layer having a third band gap energy which is higher than the second band gap energy;
forming a fourth tunnel insulation layer on the third tunnel insulation layer, the fourth tunnel insulation layer having a fourth band gap energy which is lower than the third band gap energy; and
forming a fifth tunnel insulation layer on the fourth tunnel insulation layer, the fifth tunnel insulation layer having a fifth band gap energy which is higher than the fourth band gap energy.

10. The method of claim 9,
wherein forming the second tunnel insulation layer comprises depositing a silicon oxy-nitride layer,
and wherein forming the fourth tunnel insulation layer comprises depositing a silicon oxy-nitride layer.

11. The method of claim 10, wherein the second tunnel insulation layer has a thickness of about 10 Å to about 30 Å.

12. The method of claim 10, wherein forming the third tunnel insulation layer comprises partially oxidizing the second tunnel insulation layer.

13. The method of claim 12, wherein partially oxidizing the second tunnel insulation layer comprises partially oxidizing the second tunnel insulation layer using $O_2$ gas, $H_2$ gas and $O_2$ gas, $N_2O$ gas or NO gas.

14. The method of claim 12, wherein forming the third tunnel insulation layer comprises removing shallow trap site in the second tunnel insulation layer.

15. The method of claim 9, wherein the third tunnel insulation layer has a thickness below about 10 Å.

16. The method of claim 10, wherein forming the fifth tunnel insulation layer comprises partially oxidizing the fourth tunnel insulation layer.

17. The method of claim 16, wherein partially oxidizing the fourth tunnel insulation layer comprises partially oxidizing the fourth tunnel insulation layer using $N_2O$ gas, $O_2$ gas or NO gas.

18. A vertical memory device, comprising:
a channel extending in a first direction substantially perpendicular to a top surface of a substrate;
a charge storage layer structure including a tunnel insulation layer structure, a charge storage layer pattern and a blocking layer pattern which are sequentially stacked on a sidewall of the channel in a second direction substantially parallel to the top surface of the substrate; and
a plurality of gate electrodes arranged on a sidewall of the charge storage layer structure and spaced apart from each other in the first direction,
wherein the tunnel insulation layer structure comprises first, second, third, fourth and fifth tunnel insulation layers sequentially stacked on the sidewall of the channel in the second direction, and wherein the first tunnel insulation layer has a first band gap energy, the second tunnel insulation layer has a second band gap energy that is lower than the first band gap energy, and the third tunnel insulation layer has a third band gap energy that is higher than the second band gap energy.

19. The vertical memory device of claim 18, wherein each of the first, second, third, fourth and fifth tunnel insulation layers has a nitrogen concentration which is different from nitrogen concentrations of adjacent tunnel insulation layers.

20. The vertical memory device of claim 18, wherein the fourth tunnel insulation layer has a fourth band gap energy that is lower than the third band gap energy, and the fifth tunnel insulation layer has a fifth band gap energy that is higher than the fourth band gap energy.

* * * * *